(12) United States Patent
Nishimura et al.

(10) Patent No.: US 9,029,694 B2
(45) Date of Patent: May 12, 2015

(54) PHOTOELECTRIC CONVERSION ELEMENT AND SOLAR CELL

(75) Inventors: Kazukuni Nishimura, Tokyo (JP); Kazuya Isobe, Tokyo (JP); Kenichi Onaka, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 893 days.

(21) Appl. No.: 13/193,693

(22) Filed: Jul. 29, 2011

(65) Prior Publication Data

US 2012/0042953 A1 Feb. 23, 2012

(30) Foreign Application Priority Data

Aug. 19, 2010 (JP) .................. 2010-183728

(51) Int. Cl.
| | |
|---|---|
| *H01L 51/00* | (2006.01) |
| *H01G 9/20* | (2006.01) |
| *C08G 61/12* | (2006.01) |
| *H01L 51/42* | (2006.01) |

(52) U.S. Cl.
CPC .......... *H01L 51/0037* (2013.01); *H01G 9/2004* (2013.01); *H01G 9/2059* (2013.01); *H01L 51/006* (2013.01); *H01L 51/0061* (2013.01); *H01L 51/0068* (2013.01); *H01L 51/4226* (2013.01); *C08G 61/126* (2013.01); *C08G 2261/1424* (2013.01); *C08G 2261/3223* (2013.01); *C08G 2261/91* (2013.01); *Y02E 10/542* (2013.01); *Y02E 10/549* (2013.01)

(58) Field of Classification Search
CPC .......... H01L 51/0037; H01L 51/422–51/4233; H01G 9/2004–9/2018
See application file for complete search history.

(56) References Cited

U.S. PATENT DOCUMENTS

2009/0092902 A1* 4/2009 Abouimrane et al. ........ 429/306

FOREIGN PATENT DOCUMENTS

| | | | |
|---|---|---|---|
| JP | 2000106223 A * | 4/2000 | ............ H01M 14/00 |
| JP | 2003-317814 | 11/2003 | |

OTHER PUBLICATIONS

Machine translation of JP 2000106223 A, pub. Apr. 2000.*
B. O'Regan and M. Gratzel: Nature, 353, 737 (1991) (pp. 737-740).
J. Xia and N. Masaki, M. Lira-Cantu, Y. Kim, K. Jiang and S. Yanagida: Journal of the American Chemical Society, 130, 1258 (2008) (pp. 1258-1263).

* cited by examiner

*Primary Examiner* — Allison Bourke
(74) *Attorney, Agent, or Firm* — Lucas & Mercanti, LLP

(57) ABSTRACT

A photoelectric conversion element comprising a substrate, a first electrode, a photoelectric conversion layer comprising a semiconductor and a sensitizing dye, a hole transport layer and a second electrode, wherein the hole transport layer comprises a polymer having a repeat unit represented by Formula (1) or (2), Formula (1)

Formula (2)

17 Claims, 1 Drawing Sheet

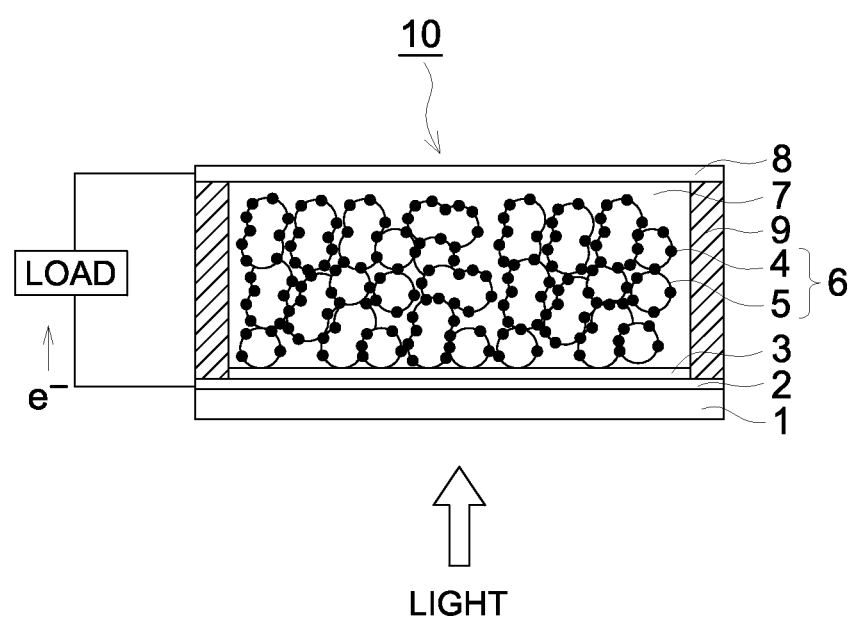

PHOTOELECTRIC CONVERSION ELEMENT AND SOLAR CELL

This application is based on Japanese Patent Application No. 2010-183728 filed on Aug. 19, 2010 in Japanese Patent Office, the entire content of which is hereby incorporated by reference.

FIELD OF THE INVENTION

The present invention relates to a dye-sensitized photoelectric conversion element and a solar cell constituted by employing the photoelectric conversion element.

BACKGROUND OF THE INVENTION

In recent years, sunlight energy has attracted attention as an energy source in view of environmental problems.

Methods to convert the light or heat of sunlight into electric energy which is one of the typical easily usable energy forms have been put to practical use.

In these methods, the method to convert the sunlight into electric energy, for example, is a typical example, and a photoelectric conversion element is used for this method.

As photoelectric conversion elements, widely utilized have been those employing inorganic materials, for example, single crystal silicon, polycrystalline silicon, amorphous silicon, cadmium telluride and copper indium gallium selenide. Such a photoelectric conversion element has been widely used for so called "a solar cell".

In such a solar cell employing a photoelectron conversion element in which an inorganic material is used, there have been problems, for example: a highly purified material of, for example, silicon which is used as a constituting material, is needed, the highly purified material being produced via a high purification process; and the manufacturing cost of the solar cell is high because the cell is manufactured via a large number of complicated processes due to the multi-layered p-n junction structure.

On the other hand, investigation of a photoelectric conversion element using an organic material, which has a simpler structure, has also been advanced.

For example, proposed has been an organic p-n junction type photoelectric conversion element in which a perylene tetracarboxylic acid derivative which is an n-type organic dye and copper phthalocyanine which is a p-type organic dye are joined.

In order to improve the shorter exciton diffusion length and the thinner space charge layer which have been considered as demerits of an organic photoelectric conversion element, the attempts to increase the area of p-n junction by simply laminating organic layers to sufficiently keep the number of organic dyes taking part in the charge separation is achieving its object.

Also, there has been proposed a method in which an n-type electron transporting organic material and a p-type hole transporting polymer are mixed in a layer to form a composite to drastically increase the area of p-n junction, whereby charge separation is carried out in whole the layer. Furthermore, a photoelectron conversion element employing a conjugated polymer as a p-type conductive polymer in which fullerene is mixed as an electronic conducting material is proposed.

Although these photoelectric conversion elements are raising the characteristics gradually, a stable performance while keeping a high conversion efficiency has not been fully obtained.

In 1991, as the results of large number of precise experiments on a photoelectric current sensitized by a dye absorbed on porous titanium dioxide, Gratzel succeeded to produce a photoelectric conversion element which stably exhibits a high conversion efficiency by providing a sufficient area for charge separation or a sufficient number of molecules taking part in charge separation employing a porous titanium oxide (for example, refer to Non-Patent Document 1).

In this photoelectric conversion element, there repeated is a cycle in which a dye adsorbed on the porous titanium oxide is photo-excited, first, to inject electrons to the titanium oxide while the dye is formed into a cation of the dye, and the cation of the dye receives an electron migrated from the counter electrode through a hole transfer layer.

Combined with the stable nature of titanium dioxide, this photoelectric conversion element exhibits an excellent reproducibility, and the base of development has widely spread. This photoelectric conversion element is referred to as "a dye-sensitized solar cell", and has attracted high expectations and attentions.

This method has many advantages, for example, an inexpensive metal compound semiconductor, such as titanium dioxide, can be used without refinement to high purity, whereby cheap semiconductor materials can be used, and, further, light of a wide range of visible light can be utilized, whereby the sun light having a wide range of visible light can be effectively converted into electric energy.

However, this method has problems, for example, an expensive ruthenium complex is necessary because a ruthenium complex is used in the photoelectric conversion layer, ruthenium having a resource restriction.

As a further problem of this method, an additional mechanism which retains the electrolyte liquid or iodine in the element or prevents those from flowing out or dissipation since such a solar cell is operated employing an electrolyte liquid, as aforementioned.

Typical examples of an electrochemical element having an electrolyte liquid include a lead-acid battery and a lithium battery. Even in these electrochemical elements fabricated in a compact module, the electrolyte is not fully recovered and recycled, and it is obvious that a secondary problem may be induced when dissipated chemicals are newly accumulated in the environment.

Development of an all solid dye-sensitized solar cell free from these electrolyte problems while keeping the advantage of the dye-sensitized solar cell is progressing.

In this field, a dye-sensitized solar cell employing an amorphous organic hole transport material, or a dye-sensitized solar cell employing copper iodide as a hole transport material has been known. However, not fully sufficient photoelectric conversion efficiency has been obtained due to the lower conductivity of the hole transport material.

As a hole transport material exhibiting a higher conductivity, polythiophene materials are raised as typical examples, and an all solid dye-sensitized solar cell using PEDOT as a hole transport material has been reported (for example, refer to Patent Documents 1 and Non-Patent Document 2).

However, since PEDOT has absorption in a visible light range (400-700 nm), loss in light absorption by the dye occurs, and the photoelectric conversion efficiency has not been fully enough. Moreover, since PEDOT suffers from deterioration due to light exposure, the durability of PEDOT has not been fully enough.

Patent Document 1 Japanese patent publication application (hereafter referred to as JP-A) No. 2003-317814

Non-Patent Document 1 B. O'Regan and M. Gratzel: Nature, 353, 737 (1991)

Non-Patent Document 2 J. Xia and N. Masaki, M. Lira-Cantu, Y. Kim, K. Jiang and S. Yanagida: Journal of the American Chemical Society, 130, 1258 (2008)

SUMMARY OF THE INVENTION

The present invention was achieved in view of the foregoing problems. An object of the present invention is to provide an all solid dye-sensitized photoelectric conversion element exhibiting a stable photoelectric conversion efficiency and photoelectric conversion property and a solar cell employing the photoelectric conversion element.

One of the aspects to achieve the above object of the present invention is a photoelectric conversion element comprising a substrate, a first electrode, a photoelectric conversion layer comprising a semiconductor and a sensitizing dye, a hole transport layer and a second electrode, wherein
the hole transport layer comprises a polymer having a repeat unit represented by Formula (1) or (2),

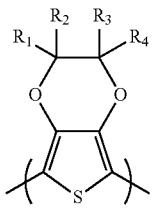

Formula (1)

wherein at least one of $R_1$-$R_4$ is a straight chain or a branched chain alkyl group having 1 to 24 carbon atoms, a cycloalkyl group having 3 to 9 carbon atoms, an alkoxy group having 1 to 18 carbon atoms, a polyethylene oxide group having 1 to 18 carbon atoms or an aryl group, and remaining substituent is a hydrogen atom,

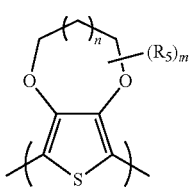

Formula (2)

wherein n is an integer of 1 to 3, m is an integer of 0 to 2n+4, $R_5$ is a halogen atom or an alkyl group, and when a plurality of $R_5$ groups are contained, each $R_5$ group may be different from each other.

BRIEF DESCRIPTION OF THE DRAWING

FIG. 1 is a schematic cross sectional view showing an example of the photoelectric conversion element of the present invention.

DESCRIPTION OF THE PREFERRED EMBODIMENTS

As the results of examinations on varieties of novel materials based on an idea that it is necessary to develop a highly conductive hole transport material having no absorption in the visible light region, in order to overcome the foregoing problems, a polymer hole transport material having a novel chemical structure has come to be found.

The above object of the present invention is achieved by the following structures.

(1) A photoelectric conversion element comprising a substrate, a first electrode, a photoelectric conversion layer comprising a semiconductor and a sensitizing dye, a hole transport layer and a second electrode, wherein
the hole transport layer comprises a polymer having a repeat unit represented by Formula (1) or (2),

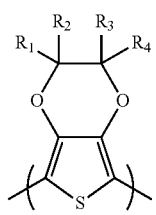

Formula (1)

wherein at least one of $R_1$-$R_4$ is a straight chain or a branched chain alkyl group having 1 to 24 carbon atoms, a cycloalkyl group having 3 to 9 carbon atoms, an alkoxy group having 1 to 18 carbon atoms, a polyethylene oxide group having 1 to 18 carbon atoms or an aryl group, and remaining substituent is a hydrogen atom,

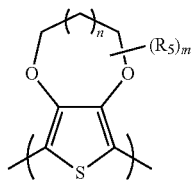

Formula (2)

wherein n is an integer of 1 to 3, m is an integer of 0 to 2n+4, $R_5$ is a halogen atom or an alkyl group, and when a plurality of $R_5$ groups are contained, each $R_5$ group may be different from each other.

(2) The photoelectric conversion element of Item 1, wherein at least one of $R_1$-$R_4$ of Formula (1) is a straight chain alkyl group having 6 to 18 carbon atoms.

(3) The photoelectric conversion element of Item 1, wherein n of Formula (2) is 1.

(4) The photoelectric conversion element of any one of Items 1 to 3, wherein an absorbance of the polymer is 0.2 to 1.0.

(5) The photoelectric conversion element of any one of Items 1 to 4, wherein the sensitizing dye has a substructure represented by Formula (3),

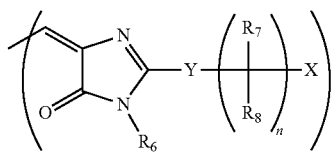

Formula (3)

wherein $R_6$ represents a hydrogen atom, a substituted or non-substituted alkyl group, an alkenyl group, an alkynyl group, an aryl group, an amino group, a cyano group or a heterocyclic group, Y represents a sulfur atom, an oxygen atom or a selenium atom, $R_7$ and $R_8$ each represents a hydrogen atom, a halogen atom, a hydroxyl group a thiol group, a cyano group, a substituted or non-substituted alkyl group, an aryl group, an alkenyl group, an alkynyl group, an alkoxy group, an amino group or a heterocyclic group, provided that these groups may be mutually combined to form a ring structure, n represents an integer of 0 or more, and in the case when n≥2, two or more $R_7$ may be the same or different and two or more $R_8$ may be the same or different, X represents an acidic group, and, when a carbon-carbon double bond is included in Formula (3), the double bond may be either a cis-form or a trans-form.

(6) The photoelectric conversion element of any one of Items 1 to 5, wherein the semiconductor comprises a titanium oxide.

(7) The photoelectric conversion element of any one of Items 1 to 6, wherein the polymer further comprises a repeat unit derived from a divalent organic group represented by Formula (4),

  Formula (4)

wherein Ar represents an organic divalent group having a π-conjugated structure.

(8) The photoelectric conversion element of Item 7, wherein the repeat unit derived from the divalent organic group represented by Formula (4) is derived from a thiophene derivative, a pyrrole derivative or a furan derivative.

(9) The photoelectric conversion element of any one of Items 1 to 8, wherein the hole transport layer comprises a salt comprising an organic anion.

(10) The photoelectric conversion element of any one of Items 1 to 8, wherein the hole transport layer comprises Li[(CF$_3$SO$_2$)$_2$N].

(11) The photoelectric conversion element of any one of Items 1 to 10, wherein a content of the polymer in the hole transport layer is 50 to 100 mass % based on the mass of the hole transport layer.

(12) The photoelectric conversion element of any one of Items 1 to 11, wherein a content of the polymer in the hole transport layer is 90 to 100 mass % based on the mass of the hole transport layer.

(13) The photoelectric conversion element of any one of Items 1 to 12, wherein the hole transport layer is subjected to hole doping and an amount of doped hole is 0.15 to 0.66 hole per one repeat unit represented by Formula (1) or (2).

(14) The photoelectric conversion element of Item 13, wherein an ionization potential of the polymer being subjected to hole doping is 4.5 eV to 5.5 eV.

(15) The photoelectric conversion element of Item 13, wherein an ionization potential of the polymer being subjected to hole doping is 4.7 eV to 5.3 eV.

(16) The photoelectric conversion element of any one of Items 1 to 15, wherein the polymer is formed via electropolymerization carried out on the photoelectric conversion layer.

(17) The photoelectric conversion element of Item 16, wherein the polymer is formed via electropolymerization while being irradiated with light.

(18) The photoelectric conversion element of any one of Items 1 to 17, wherein the photoelectric conversion layer is formed via electropolymerization employing a monomer represented by Formula (1') or (2'), or a multimer thereof,

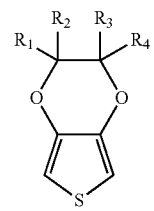  Formula (1')

wherein at least one of $R_1$-$R_4$ is a straight chain or a branched chain alkyl group having 1 to 24 carbon atoms, a cycloalkyl group having 3 to 9 carbon atoms, an alkoxy group having 1 to 18 carbon atoms, a polyethylene oxide group having 1 to 18 carbon atoms or an aryl group, and remaining substituent is a hydrogen atom,

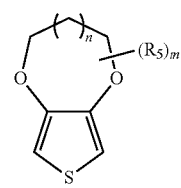  Formula (2')

wherein n is an integer of 1 to 3, m is an integer of 0 to 2n+4, $R_5$ is a halogen atom or an alkyl group, and when a plurality of $R_5$ groups are contained, each $R_5$ group may be different from each other.

(19) A solar cell employing the photoelectric conversion element of any one of Items 1 to 18.

According to the present invention, a photoelectric conversion element and a solar cell exhibiting a stable photoelectric conversion efficiency and photoelectric conversion property can be obtained.

The photoelectric conversion element of the present invention is characterized in that, in a photoelectric conversion element containing a substrate, a first electrode, a photoelectric conversion layer containing a semiconductor and a sensitizing dye, a hole transport layer (also referred to a positive hole transport layer) and a second electrode, the hole transport layer contains a polymer having a repeat unit represented by Formula (1) or (2).

In the present invention, a photoelectric conversion element and a solar cell each exhibiting a stable photoelectric conversion efficiency and photoelectric conversion property can be obtained by reducing the absorbance in the visible ray region (a wavelength of 400-700 nm) of the hole transporting layer by using the above-mentioned specific polymer specifically in to the hole transport layer.

(Photoelectric Conversion Element)

The photoelectric conversion element of the present invention will be explained with referring to FIG. 1.

FIG. 1 is a schematic cross sectional view showing an example of the photoelectric conversion element of the present invention.

As shown in FIG. 1, the photoelectric conversion element 10 contains a substrate 1, a first electrode 2, a photoelectric conversion layer 6, a hole transporting layer 7, a second electrode 8, and a partition wall 9.

The photoelectric conversion layer 6 contains a semiconductor 5 and a sensitizing dye 4.

A barrier layer 3 is preferably provided between the first electrode 2 and the photoelectric conversion layer 6, for the purposes of avoiding formation of a short circuit and providing a sealing effect.

Sunlight enters along the direction of the arrow in the lower part of the figure.

An example of a method of manufacturing the photoelectric conversion element of the present invention will be described below.

After forming a barrier layer 3 on a substrate 1 provided with a first electrode 2, a semiconductor layer containing a semiconductor is formed on the barrier layer 3, followed by adsorbing a sensitizing dye on the semiconductor surface to form a photoelectric conversion layer 6. Then, a hole transport layer 7 is formed on the photoelectric conversion layer 6.

The hole transport layer 7 gets through the photoelectric conversion layer composed of a semiconductor which carries the sensitizing dye, as well as is formed over the photoelectric conversion layer, and a second electrode 8 is formed on hole transport layer. A terminal can be attached to each of the first electrode 2 and the second electrode 8, whereby an electric current can be taken out.

(Hole Transport Layer)

The hole transport layer is a layer which has a function to promptly reduce the oxidized sensitizing dye after absorbing light and injecting an electron into the semiconductor, and to convey the hole (also referred to as the positive hole) injected from the sensitizing dye at the interface to the second electrode.

The hole transport layer contains the polymer which has a repeat unit represented by aforementioned Formula (1) or (2).

At least one of $R_1$-$R_4$ is an alkyl group of a straight chain or a branched chain having a carbon number of 1-24, a cycloalkyl group having a carbon number of 3-9, an alkoxy group having a carbon number of 1-18, a polyethylene oxide group having a carbon number of 1-18 or an aryl group. The remaining substituent is a hydrogen atom.

It is preferable that only $R_1$ is an alkyl group of a normal chain or a branched chain having a carbon chain length of 1-24, a cycloalkyl group having a carbon chain length of 3-9, an alkoxy group having a carbon chain length of 1-18, a polyethylene oxide group having a carbon chain length of 1-18 or an aryl group, and $R_2$-$R_4$ each is a hydrogen atom.

Examples of an aryl group which may be substituted or non-substituted include a phenyl group, a naphthyl group, a biphenyl group, a fluorenyl group, a antholyl group, a pyrenyl group, an azulenyl group, an acenaphthylenyl group, a terphenyl group and a phenantholyl group.

Although the carbon atom which has one of $R_1$-$R_4$ may be an asymmetrical atom, it may be of a chiral form or a racemic form.

In Formula (2), n is an integer of 1-3, and m is an integer of 0-2n+4. $R_5$ is a halogen atom or an alkyl group, and when there are a plurality of $R_5$ groups, each may be different from each other.

The polymer which has a repeat unit represented by Formula (1) or (2) can be obtained by polymerizing or copolymerizing one kind or two kinds or more of monomers corresponding to these repeat units, if necessary, together with other monomer, under existence of a metal complex of a polymerization catalyst.

Monomers corresponding to the repeat unit represented by aforementioned Formula (1) or (2) will be shown below, however, the present invention is not limited thereto.

The monomer corresponding to the repeat unit represented by aforementioned Formula (1) or a Formula (2) is a monomer represented by aforementioned Formula (1') or Formula (2'), and $R_1$-$R_4$ and $R_5$ of the monomer structure represented by Formula (1') or (2') are the same as those of the structure of the repeat unit represented by Formula (1) or (2).

Monomers corresponding to the repeat unit of Formula (1).

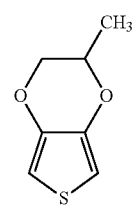

M1-1

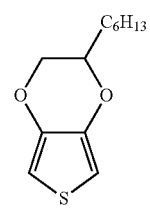

M1-2

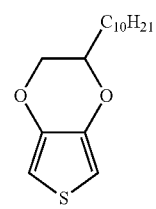

M1-3

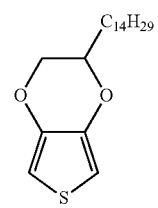

M1-4

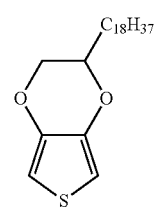

M1-5

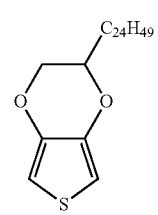

M1-6

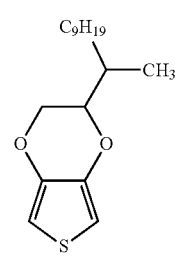

M1-7

M1-8
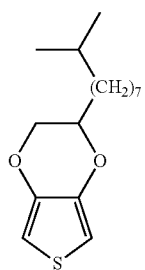
M1-9
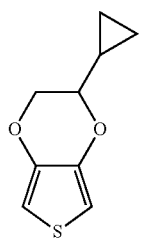
M1-10
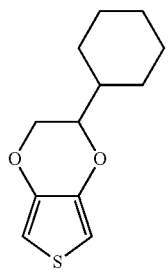
M1-11
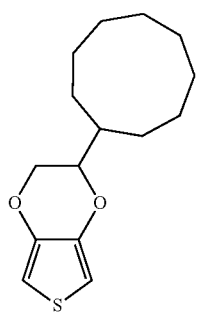
M1-12
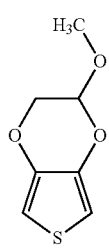
M1-13
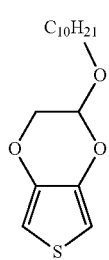
M1-14
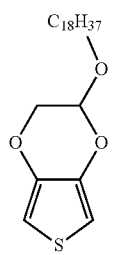
M1-15
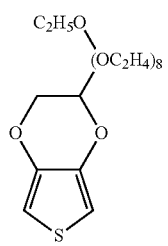
M1-16
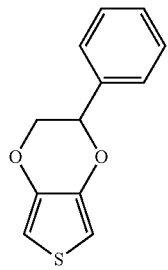
M1-17
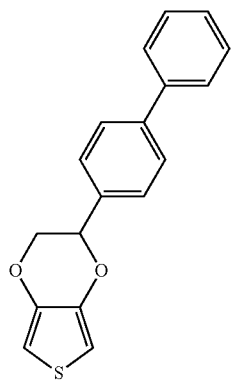
M1-18
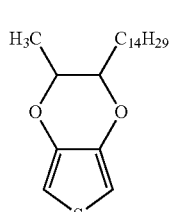
M1-19
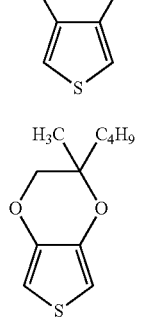

-continued

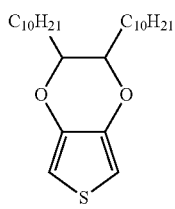
M1-20

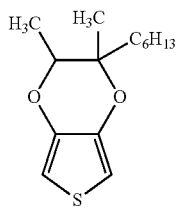
M1-21

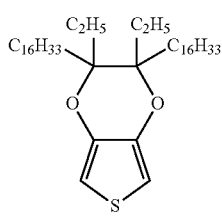
M1-22

Monomers corresponding to the repeat unit of Formula (2).

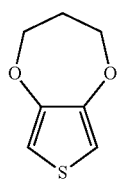
M2-1

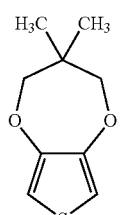
M2-2

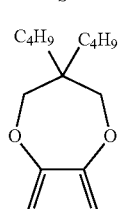
M2-3

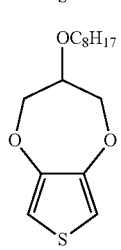
M2-4

-continued

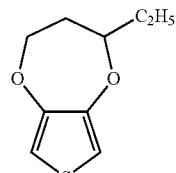
M2-5

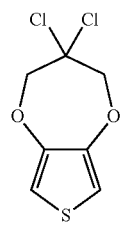
M2-6

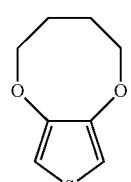
M2-7

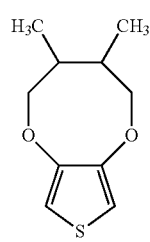
M2-8

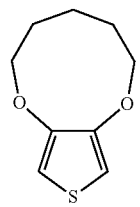
M2-9

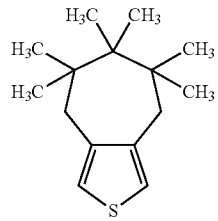
M2-10

The monomer corresponding to the repeat unit represented by above mentioned Formula (1) or Formula (2) is preferably multimerized to, for example, a dimer or trimer (namely, a oligomerized compound), before polymerization or copolymerization.

These monomers can be synthesized according to the method described, for example, by J. R. Reynolds et al., Adv. Mater, 11, 1379 (1999). Further, the dimers of the above monomers can be obtained according to the method described, for example, by T. M. Swager et al., Journal of the American Chemical Society, 119, 12568 (1997).

(Synthesis of M1-4)

Under a nitrogen atmosphere, 1.44 g (10.0 mmol) of 3,4-dimethoxy thiophene, 2.58 g (10.0 mmol) of 1,2-hexadecanediol and 157 mg (0.83 mmol) of p-toluenesulfonic acid monohydrate were dissolved in 60 ml of toluene, and, then, heated at 85-90° C. for 21 hours. After cooling, the product was washed with water, the obtained organic phase was dried with MgSO$_4$, and the filtrate was condensed. The product was purified via silica-gel-column-chromatography using heptane:ethylacetate (19:1) to obtain 1.77 g (5.2 mmol, 52%) of M1-4 as a yellowish white solid. $^1$H-NMR (CHCl$_3$): δ(ppm) 0.88 (t, 3H) 1.26 (br, 24H) 1.67 (br, 2H) 3.87 (m, 1H) 4.13 (m, 2H) 6.30 (s, 2H).

(Synthesis of the Dimer (DM1-4) of M1-4)

Under a nitrogen atmosphere, 1.015 g (3.00 mmol) of M1-4 was dissolved in 12 ml of anhydrous THF, and 0.90 ml (6.0 mmol) of N,N,N',N'-tetramethylethylenediamine was added.

After cooling the solution to −10° C., 1.8 ml (3.0 mmol) of hexane solutions of n-butyl lithium (1.67M) was added. In another container under a nitrogen atmosphere, 1.057 g (2.99 mmol) of iron (III) acetylacetonate was dissolved in 12 ml of anhydrous THF, and the above reaction solution was added therein, followed by heat refluxing for 6 hours. The product mixture was subjected to vacuum concentration, purified via silica-gel-column-chromatography using heptane:ethylacetate (19:1), and further purified via molecular sieve chromatography to obtain 328 mg (0.49 mmol, 32%) of DM1-4 as a yellowish white solid. $^1$H-NMR (CHCl$_3$): δ(ppm) 0.88 (t, 6H) 1.26 (br, 48H) 1.68 (br, 4H) 3.93 (m, 2H) 4.18 (m, 4H) 6.23 (s, 2H).

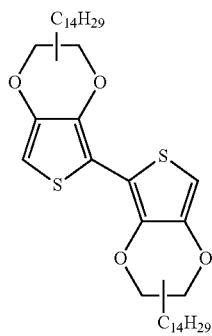

DM1-4

When a multimer such as a dimer is used, the oxidation potential at the time of polymerization becomes lower when compared with the case in which a monomer is used, whereby the synthesizing rate of a polymer is increased, which is preferable.

(Method of Polymerizing the Polymer of the Present Invention)

The method of polymerization includes:

a chemical polymerization method using a polymerization catalyst;

an electropolymerization method in which polymerization is carried out by applying a voltage between electrodes containing at least a working electrode and a counter electrode;

a photopolymerization method in which photo irradiation is carried out alone or in combination with heating or electrolysis. Of these, the polymerization method employing electropolymerization is preferable.

According to the electropolymerization method, the aforementioned hole transport layer is formed at the same time as the polymerization. When obtaining a polymer by an electropolymerization method, a synthesis of a polymer leads to formation of the above-mentioned hole transport layer as it is. Namely, the following electropolymerization method is conducted.

A monomer corresponding to the repeat unit represented by aforementioned Formula (1) or (2), or a dimer thereof is dissolved in a solvent, for example, acetonitrile, tetrahydrofuran, propylene carbonate, dichloromethane, o-dichlorobenzene and dimethylformamide, and a supporting electrolyte which is a salt of, for example, lithium perchlorate, lithium tetrafluoroborate, tetrabutylammonium perchlorate and Li[(CF$_3$SO$_2$)$_2$N], is added to obtain a liquid for electropolymerization.

The solvent is not specifically limited as far as it dissolves the supporting electrolyte and the aforementioned monomer or a dimer thereof. As a supporting electrolyte, one which enables electrolytic dissociation is used, and it is not specifically limited. Specifically, a supporting electrolyte exhibiting a high solubility in the solvent and hardly oxidized or reduced is preferably used.

Subsequently, a substrate 1 on which a transparent conductive film 2, a barrier layer 3, and a photoelectric conversion layer 6 have been formed is dipped in the liquid for electropolymerization, and direct current electrolysis is carried using the photoelectric conversion layer 6 as a working electrode, a platinum plate, for example, as a counter electrode, and a reference electrode such as Ag/AgCl. The concentration of the aforementioned monomer or its dimer in the liquid for electropolymerization is preferably 0.1-1000 mmol/L. The concentration of the supporting electrolyte is preferably 0.1-2 mol/L. Further, the applied current density is preferably 0.01 μA/cm$^2$-1000 μA/cm$^2$, and more preferably in the range of 1 μA/cm$^2$-500 μA/cm$^2$. The temperature of the liquid for electropolymerization is preferably in the range in which the solvent does not solidify or boil, and is generally −30° C. to 80° C. Since the electrolysis voltage, the electrolysis current, the electrolysis duration, and the temperature depend on the used material or on the desired thickness of the layer, these conditions may be suitably selected.

It is difficult to estimate the polymerization degree of the polymer obtained via an electropolymerization method, however, since the solubility to the solvent of the hole transport layer formed after polymerized is largely decreased, polymerization of the hole transport layer can be confirmed as follows, namely, the hole transport layer is dipped in tetrahydrofuran (THF), and the polymerization is judged from the solubility of the obtained hole transport layer. Tetrahydrofuran (THF) is a solvent which dissolves the monomer corresponding to the repeat unit represented by Formula (1) or (2).

More concretely, 10 mg of the compound (namely, the polymer) is weighed in a 25 ml sample bottle, and 10 mg of THF is added, followed by applying ultrasonic wave (25 kHz and 150 W, collector current of 1.5 A, 150 produced by ULTRASONIC INDUSTRIAL Co.) When the amount of dissolved compound is 5 mg or less, the compound is specified to be polymerized.

On the other hand, in the case when chemical polymerization is conducted, the monomer corresponding to the repeat unit represented by aforementioned Formula (1) or (2), or a dimer thereof is polymerized using the following polymerization catalyst. Examples of such a catalyst include: iron(III) chloride, iron(III) tris-p-toluenesulfonate, iron(III) p-dodecylbenzenesulfonate, iron(III) methanesulfonate, iron(III) p-ethylbenzenesulfonate, iron(III) naphthalenesulfonate, and a hydrate thereof.

The polymerization rate adjuster used in the chemical polymerization is not specifically limited as far as it is a weak complexing agent to the trivalent iron ion in the above mentioned polymerization catalyst, and reduces the polymerization rate while the layer is formed. When the polymerization rate adjuster is iron(III) chloride or its hydrate, an aromatic oxysulfonic acid such as 5-sulphosalicylic acid may be used as a polymerization rate adjuster, and when the polymerization rate adjuster is iron(III) tris-p-toluenesulfonate, iron(III) p-dodecylbenzenesulfonate, iron(III) methanesulfonate, iron (III) p-ethylbenzenesulfonate, iron(III) naphthalenesulfonate, or a hydrate thereof, imidazole may be used as a polymerization rate adjuster.

The polymer may be applied on the photoelectric conversion layer while being incorporated in a coating liquid after polymerized, however, it is one of the preferable aspects that polymerization is carried out on the photoelectric conversion layer to form a hole transport layer. In such a case, a hole transport layer forming liquid containing a monomer corresponding to the repeat unit represented by aforementioned Formula (1) or (2), or a dimmer thereof, the aforementioned polymerization catalyst, the aforementioned polymerization rate adjuster and other additive is used, in order to obtain a polymer. The total mass concentration of each of the above components is 1-50% based on the total mass of the liquid, although it depends on the kind of each of the monomer corresponding to the repeat unit represented by aforementioned Formula (1) or (2), or a dimmer thereof, the polymerization catalyst, the polymerization rate adjuster and other additive, the amount ratio, the applying condition and the desired thickness of the layer after polymerization.

A polymerization reaction is conducted, after applying the above mentioned hole transport layer forming liquid with a coating method on a photoelectric conversion layer, or while a photoelectric conversion layer is immersed in the hole transport layer forming liquid.

With respect to the preferable polymerization conditions, the heating temperature is preferably 25-120° C., when heated in air, and the duration of heating is preferably 1 minute-24 hours, although those conditions depend on the kind, amount ratio, concentration of each of the monomer corresponding to the repeat unit represented by aforementioned Formula (1) or (2), or a dimmer thereof, the polymerization catalyst, the polymerization rate adjuster and other additive, the thickness of applied liquid layer and the desired polymerization rate.

The polymer of the present invention contains a repeat unit represented by Formula (1) or (2), however, a repeat unit other that the repeat unit of the present invention may also be contained within the range in which the effect of the present invention is not lost. Examples of such a repeat unit include those derived from monomers including a thiophene derivative, a pyrrole derivative and a furan derivative.

Such a repeat unit used together preferably contains a divalent organic group having a π-conjugated structure represented by following Formula (4).

Formula (4)

In above Formula (4), Ar represents a divalent organic group having a π-conjugated structure. Here, the "π-conjugated structure" means a structure in which double bonds and single bonds are alternately coupled. When such an organic group having a π-conjugated structure exists in a polymer, a π-conjugated plane is spread over the polymer, whereby the property of a p-type semiconductor is increased, since the electron donating property of the repeating represented by Formula (1) or (2) is enhanced.

When forming a hole transport layer by a coating method, the aforementioned hole transport layer forming liquid is used. Examples of a solvent of such a coating liquid include: polar solvents, for example, tetrahydrofuran (THF), butylene oxide, chloroform, cyclohexanone, chlorobenzene, acetone, various alcohols; and aprotic solvents, for example, dimethylformamide (DMF), acetonitrile, dimethoxy ethane, dimethyl sulfoxide and hexamethylphosphoric triamide. These solvents may used alone or in combination of two kinds or more.

In a hole transport layer, an additive, such as $N(PhBr)_3$ $SbCl_6$ or $Li[(CF_3SO_2)_2N]$ may be added, if needed.

As a method of applying, various methods of application, such as a dipping method, a dropping method, a doctor blade method, a spin coat method, a brush coating method, a spray coating method or a roll coater can be used.

Moreover, such a coating method may be repeated to form a laminated layer.

The content of the polymer which has a repeat unit represented by Formula (1) or (2) in the hole transport layer is preferably 50-100 mass %, and is more preferably 90-100 wt % based on the mass of the hole transport layer.

In order to increase the conductivity of the hole transport layer of the present invention, it is preferable that the hole transport layer is subjected to hole doping (namely, positive hole doping). The amount of hole doping per repeat unit represented by Formula (1) or (2) is preferably 0.15-0.66 (hole).

In the electropolymerization method, hole doping is carried out by oxidizing the polymer having the repeat unit represented by Formula (1) or (2) via application of an electric field.

The electropolymerization is preferably carried out while being irradiated with light, since the polymer is tightly formed on the titanium oxide surface.

In order to reduce the oxidant form of the sensitizing dye in the photoelectric conversion layer, it is preferable that the ionization potential of the polymer of the present invention is smaller that the ionization potential of the dye-absorbed electrode. Accordingly, the preferable range of the ionization potential of the polymer of the present invention may become different depending on the employed sensitizing dye. However, the ionization potential of the polymer of the present invention while being doped is preferably 4.5 eV or more but 5.5 eV or less, and is more preferably 4.7 eV or more but 5.5 eV or less.

The reason why a photoelectric conversion element exhibiting excellent stability in photoelectric conversion efficiency and in photoelectric conversion property by using the hole transport layer of the present invention is not fully clear, however, it is deduced as follows.

Generally light absorption by a conducting polymer in the visible and infrared region (wavelength of 400 nm or more) is originated from the following three phenomena: [1] the π-π* transition of a neutral conjugated polymer (wavelength of 400-700 nm), [2] light absorption due to a polaron (wavelength of 500-1500 nm), and [3] light absorption due to a bipolaron (wavelength of 1000 nm or more). Therefore, in order to be transparent in the visible region (wavelength of 400-700 nm), the light absorption due to above items [1] and [2] may be suppressed, while the light absorption due to item [3] may be allowed. When the amount of hole doped per repeat unit is 0.15-0.66, the existing ratios of the neutral conjugated portion and the polaron in the polymer of the present invention are decreased, and the bipolaron becomes the main component constituting the polymer chain. When a polymer contains a repeat unit represented by above Formula (1) or (2), formation of the bipolaron is promoted while the neutral conjugated portion and polaron is further decreased. Therefore, the transmittance in the visible region is increased.

As the results, the loss of visible light via absorption by the polymer is decreased, whereby visible light applied on the sensitizing dye is increased. Accordingly, the photoelectric conversion efficiency is deduced to be promoted.

It is also deduced that, since the light absorption ratio of the polymer itself is low, whereby deterioration of the polymer itself can be suppressed, more stabilized photoelectric conversion property can be obtained. Further, it is deduced that, since the polymer of the present invention has a functional group which promotes self-aggregation, such as a long chain alkyl group, the durability of the polymer is enhanced by forming a self-aggregation structure.

As discussed above, a low visible ray absorbing ratio of the polymer results in reduced loss of light due to absorption and suppressed light deterioration of the polymer. Accordingly, the light absorbance of the hole transport layer is preferably 1.0 or less. Alternatively, when the polymerization degree of the polymer becomes higher, the light absorbance of the polymer may slightly increase. In order to obtain a polymerization degree by which preferable hole transport function is achieved, preferable is a hole transport layer having a polymerization degree by which an absorbance of 0.2 or more is attained.

The absorbance difference of the working electrode before and after the electropolymerization was used as the absorbance of a hole transport layer. The absorbance was measured using a spectrophotometer (JASCO V-530). A titanium oxide thin layer adsorbed with the dye of an effective area of 10×20 mm$^2$ formed on a FTO conductive glass was used as a working electrode. A polymer having a repeat unit represented by Formula (1) or Formula (2) was formed on the aforementioned working electrode by applying a voltage of −0.16 V for 30 minutes to the working electrode using a platinum plate as a counter electrode and an Ag/Ag$^+$ reference electrode (AgNO$_3$, 0.01 M), while dipping the aforementioned working electrode in a liquid having the same composition as that of aforementioned liquid for electropolymerization. The electropolymerization was carried out while the working electrode was irradiated with light from the semiconductor layer side of the working electrode using a xenon lamp having a light intensity of 22 mW/cm$^2$, the light of wavelength of 430 nm or less being cut. Thus obtained polymer was formed so as to fill the vacant voids of the porous titanium oxide thin layer, and the thickness of the polymer layer was almost the same as the thickness of the titanium oxide thin layer as shown in FIG. 1. In order to eliminate the effect of the thickness variation on the absorbance value of the polymer layer, the thickness of the titanium oxide thin layer was measured and the measured absorbance value was divided by the thickness (μm) of the titanium oxide thin layer. The thickness measurement was carried out by using Dektak3030 (produced by SLOAN TECHNOLOGY Co.)

(Substrate)

The substrate is provided on the light injection side of the photoelectric conversion element (refer to FIG. 1). In view of the photoelectric conversion efficiency, the light transmittance of the substrate is preferably 10% or more, more preferably 50% or more, and specifically preferably 80%-100%.

The light transmittance means the total luminous transmittance in the visible ray region measured by the method of JIS K 7361-1:1997 (identical with ISO 13468-1:1996) "Determination of total luminous transmittance of transparent plastic materials.

The material, shape, structure, thickness and hardness of the substrate can be selected from those commonly known. It is preferable that the substrate exhibits a high luminous transmittance as described above.

The substrate can be roughly classified into substrates having stiffness such as a glass pate and an acrylic plate, and those having flexibility such as a film substrate. Among the former substrates having stiffness, a glass plate is preferable in view of heat resistance. The kind of glass is not specifically limited. The thickness of such a substrate is preferably 0.1-100 mm and more preferably 0.5-100 mm.

Examples of the latter substrate having flexibility include polyester based resin films such as a polyethylene terephthalate (PET) film, a polyethylene naphthalate film and a modified polyester film; polyolefin based resin films such as a polyethylene (PE) resin film, a polypropylene (PP) resin film, a polystyrene resin film and a cyclic olefin based resin film; vinyl based resin films such as a polyvinyl chloride film and a polyvinylidene chloride; polyvinylacetal resin films such as a polyvinylbutyral film; a polyether ether ketone (PEEK) resin film; a polysulfone (PSF) resin film; a polyether sulfone (PES) resin film; a polycarbonate (PC) resin film; a polyamide resin film; a polyimide resin film; an acrylic resin film; and a triacetyl cellulose (TAC) resin film. In addition to the above resin films, an inorganic glass film may be used as a substrate.

Any of resin films can be preferably used for a transparent resin film of the present invention, as long as it has a transmittance of 80% or more in the wavelength range of visible rays (400-700 nm). Of these, a bi-axially streched polyethylene terephthalate film, a bi-axially stretched polyethylene naphthalate film, a polyether sulfone film, a polycarbonate film are preferable in view of transparency, heat resistance, easy handling, strength and cost, but a bi-axially streched polyethylene terephthalate film and a bi-axially stretched polyethylene naphthalate film are more preferable.

The transparent substrate employed in the present invention may be subjected to a surface treatment or may be provided with an easy adhesion layer in order to secure wettability or adhesiveness. Commonly known techniques can be applied for the surface treatment and the formation of an easy adhesion layer. Examples of the surface treatment include surface activation treatments such as a corona discharge treatment, a flame treatment, a UV treatment, a high frequency treatment, a glow discharge treatment, an active plasma treatment and a laser treatment.

Examples of an easy adhesion layer include polyester, polyamide, polyurethane, a vinyl based copolymer, a butadiene based copolymer, an acrylic copolymer, a vinylidene based copolymer, and an epoxy based copolymer.

The thickness of a substrate is preferably 1-1000 μm and is more preferably 10-100 μm.

(First Electrode)

The first electrode is arranged between the substrate and the photoelectric conversion layer.

The luminous transmittance of the first electrode is preferably 80% or more and more preferably 90% or more. The description for the luminous transmittance of the first electrode is common to that for the aforementioned substrate.

The first electrode is provided on the surface of the substrate opposite to the light injection side.

Examples of a material forming the first electrode preferably include a metal (for example, platinum, gold, silver, copper, aluminum, rhodium and indium) and a metal oxide (for example, SnO$_2$, CdO, ZnO, CTO matrials (CdSnO$_3$, Cd$_2$SnO$_4$, CdSnO$_4$), In$_2$O$_3$ or CdIn$_2$O$_4$).

Among the metals, preferably used is silver which may be grid patterned in order to provide opening or formed in to a film by applying particles or nanowires of silver.

With respect to a metal oxide, preferably used is a composite material (or doped material) obtained by adding one, two or more elements selected from Sn, Sb, F and Al into the above mentioned metal oxide.

Of these, preferably used are conductive metal oxides including $In_2O_3$ doped with Sn(ITO), $SnO_2$ doped with Sb and $SnO_2$ doped with F (FTO). FTO is the most preferable in view of heat resistance.

Here, a substrate having thereon the first electrode is referred to as a conductive substrate.

The thickness of the conductive substrate is preferably 0.1 mm-5 mm.

The surface conductivity of the conductive electrode is preferably 50Ω/□ or less and more preferably 10Ω/□ or less.

The preferable range of the luminous transmittance of the conductive substrate is the same as the aforementioned preferable range of the luminous transmittance of the conductive substrate.

(Barrier Layer)

The photoelectric conversion element of the present invention preferably has a barrier layer which is film like (namely, forming a layer) provided between the first electrode and the semiconductor layer, as a short circuit prevention means.

The barrier layer and the photoelectric conversion layer are preferably porous as will be described later. In such a case, the D/C value is preferably 1.1 or more, more preferably 5 or more and further preferably 10 or more, provided that C (%) represents the porosity of the barrier layer and D (%) represents the porosity of the semiconductor layer.

Thereby, the barrier layer and the semiconductor layer each can exhibit its function more suitably.

More concretely, the porosity of the barrier layer C is preferably 20% or less, more preferably 5% or less, and still more preferably 2% or less. That is, the barrier layer is preferably a dense layer, whereby the aforementioned effect can be improved more.

The average thickness (film thickness) of the barrier layer is preferably 0.01-10 μm, and more preferably 0.03-0.5 μm, whereby, the above-mentioned effect can be improved more.

The construction materials of the barrier layer is not specifically limited, however, the following material may be cited, for example: zinc, niobium, tin, titanium, vanadium, indium, tungsten, tantalum, zirconium, molybdenum, manganese, iron, copper, nickel, iridium, rhodium, chromium, ruthenium or oxides thereof. Further, cited may be single use or combination of two or more of various metal compounds. for example: peroveskites such as strontium titanate, calcium titanate, barium titanate, magnesium titanate, strontium niobate, and composite oxides and oxide mixtures thereof; CdS; CdSe; TiC; $Si_3N_4$; SiC, and BN.

Specifically, when the hole transport layer is a p-type semiconductor, and a metal is used for the barrier layer, a metal having a value of work function smaller than that of the hole transport layer, and making a Schottky type contact is used. When a metal oxide is used for a barrier layer, a metal oxide which ohmically contacts with the transparent conductive layer and has an energy level of the conduction band lower than that of the porous semiconductor layer 4 is preferably used.

It is also possible to improve the electron migration efficiency from the porous semiconductor layer (photoelectric conversion layer) to the barrier layer by suitably selecting the metal oxide.

Among the metal oxides, preferably used is one which has a comparable electrical conductivity with the semiconductor layer (photoelectric conversion layer). Specifically, a barrier layer containing titanium oxide as a main component is preferably used.

(Photoelectric Conversion Layer)

The photoelectric conversion layer contains a semiconductor and a 1 sensitizing dye, and has a semiconductor layer which carries a sensitizing dye.

(Semiconductor)

Semiconductors usable in the semiconductor layer include simple substances such as silicon and germanium, compounds containing elements of Groups 3-5 and 13-15 of the periodical table, metal calcogenides (e.g., an oxides, a sulfide, a selenide) and metal nitrides.

Preferred metal calcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and a telluride of cadmium. Compound semiconductors include a phosphide of zinc, gallium, indium or cadmium; a gallium-arsine or copper-indium selenide; a copper-indium sulfide and a titanium nitride.

Specific examples include $TiO_2$, $SnO_2$, $Fe_2O_3$, $WO_3$, $ZnO$, $Nb_2O_5$, CdS, ZnS, PbS, $Bi_2S_3$, CdSe, CdTe, GaP, InP, GaAs, $CuInS_2$, $CuInSe_2$ and $Ti_3N_4$. Of these, $TiO_2$, ZnO, $SnO_2$, $Fe_2O_3$, $WO_3$, $Nb_2O_5$, CdS and PbS are preferred, $TiO_2$ and $Nb_2O_5$ are more preferred and $TiO_2$ (titanium oxide) is specifically preferred.

Plural semiconductors may be used in combination for the semiconductore layer.

For instance, plural kinds of the foregoing metal oxides or metal sulfides may be used in combination, or a titanium oxide semiconductor may be mixed with 20% by weight of titanium nitride ($Ti_3N_4$).

There may also be used a zinc oxide/tin oxide composite. In that case, when incorporating an additional semiconductor component other than the metal oxide or metal sulfide, the additional component is incorporated preferably in an amount of not more than 30% by mass of the metal oxide or metal sulfide.

The semiconductor relating to the present invention may be subjected to a surface treatment by using an organic base. Examples of an organic base include a diarylamine, a triarylamine, pyridine, 4-t-butylpyridine, polyvinylpyridine, quinoline, piperidine, and amidine. Of these preferred are pyridine, 4-t-butylamidine and polyvinylpyridine.

A liquid organic base is used as such and a solid organic base is dissolved in an organic solvent, and a semiconductor relating to the present invention is immersed in the liquid amine or the amine solution to perform a surface treatment.

<<Production of Semiconductor Layer>>

In the following, there will be described a preparation method of a semiconductore layer relating to the invention.

In cases where a semiconductor used for a semiconductore layer is in the form of particles, the semiconductor is coated onto or sprayed onto the conductive support to prepare a semiconductore layer. In cases where a semiconductor is in the form of film and is not supported by a conductive support, the semiconductor is adhered onto the conductive support to prepare a semiconductore layer.

In one preferred embodiment of the invention, the semiconductore layer is formed by sintering semiconductor particles on the conductive support.

When preparing a semiconductor relating to the present invention through sintering, a sensitization treatment (adsorption, filling of a porous layer or the like) of the semiconductor by using a sensitizing dye is conducted preferably after sintering. It is specifically preferred to conduct an adsorption treatment of a compound promptly after sintering and before moisture adsorption onto the semiconductor.

There will be further described a method of forming a semiconductore layer by sintering semiconductor particles.

First, there is prepared a coating liquid containing semiconductor particles. The primary particle diameter of the semiconductor particles is preferably as minute as possible, and the primary particle diameter is preferably in the range of 1 to 5000 nm, and more preferably 2 to 100 nm. The coating liquid containing fine semiconductor particles can be prepared by dispersing fine semiconductor particles in a solvent.

The fine semiconductor particles are dispersed in the form of primary particles. Any solvent capable of dispersing fine semiconductor particles is unlimitedly usable.

Such solvents include water, organic solvents and mixtures of water and an organic solvent. Specific examples of organic solvent usable in the present invention include alcohols such as methanol and ethanol, ketones such as acetone and acetylacetone, and hydrocarbons such as hexane and cyclohexane. Surfactants or a viscosity-adjusting agent (a polyvalent alcohol such as polyethylene glycol) may optionally be added to a coating liquid. The content of fine semiconductor particles in a coating liquid is preferably in the range of 0.1 to 70% by mass, and more preferably 0.1 to 30% by mass.

(Application of Coating Liquid Containing Semiconductor Fine Particles and Sintering Treatment of Formed Semiconductor Layer)

Thus obtained coating liquid containing fine semiconductor particles is coated or sprayed onto a conductive substrate, dried and sintered in the air or in an inert gas to form a semiconductor layer (or semiconductor film) on the conductive substrate.

The film obtained by coating and drying a coating liquid containing fine semiconductor particles is constituted of an aggregate of fine semiconductor particles and the particle diameter of the fine particles corresponds to the primary particle diameter of the fine semiconductor particles.

A semiconductor particle layer formed on an electrically conductive layer such as an electrically conductive substrate is weakly bonded to the conductive substrate or poorly interacts with the fine particles, resulting in poor mechanical strength. To counter this, the semiconductor particle layer is subjected to a sintering treatment to form a semiconductor layer of enhanced mechanical strength, which strongly adhered to the substrate.

In the present invention, the semiconductor layer may have any appropriate structure but a porous-structured layer (or a porous layer having voids) is preferred.

When the semiconductor layer has a porous structure, for example, a hole transport material in the hole transport layer may be preferably incorporated in the voids of the porous structure.

The porosity of the semiconductor layer is preferably 1-90% by volume, more preferably 1-80% by volume, and still more preferably 20-70% by volume. The porosity of the semiconductor layer means a porosity of pores penetrating in the thickness direction of the semiconductor layer, and the porosity can be measured by a commercially available instrument such as a mercury porosimeter (Autopore 9220, produced by Shimadzu Corp.).

The thickness of the semiconductor layer formed into a sintered layer having a porous structure is preferably at least 10 nm or more and more preferably 500-30000 nm.

To obtain a sintered layer of the foregoing porosity with controlling the real surface area of the sintered layer during the sintering treatment, the sintering temperature is preferably not higher than 1000° C., more preferably in the range of 200 to 800° C., and still more preferably 300 to 800° C.

When the substrate is less heat-resistant, for example, in the case of a plastic substrate, it is possible to tightly fix the particles each other or the particles and the substrate by pressing, instead of conducting a sintering treatment at 200° C. or more. In such a case, it is also possible to conduct a heat treatment only for the semiconductor layer without heating the substrate using a microwave.

The ratio of real surface area to apparent surface area can be controlled by the particle diameter, specific surface area or sintering temperature for the semiconductor particles.

In order to improve the efficiency of electron injection from the dye to the semiconductor particle, for example, by increasing the surface area of semiconductor particles or by increasing purity in the vicinity of semiconductor particles, after a heating treatment, there may be conducted a chemical plating treatment using an aqueous titanium tetrachloride solution or an electrolytic plating treatment using an aqueous titanium trichloride solution.

(Sensitizing Dye)

The sensitizing dye according to the present invention is carried on a semiconductor via the sensitizing treatment of the semiconductor layer which will be described later, and, at the time of light exposure, the sensitizing dye is photoexcited to produce an electromotive force. As a sensitizing dye, a well-known sensitizing dye used for a photoelectric conversion element can be used.

In view of effective injection of electric charge into the semiconductor, the sensitizing dye preferably has a carboxyl group. When the hole transport layer contains the polymer which has a repeat unit represented by Formula (1) or (2), it is preferable that the sensitizing dye has a substructure represented by aforementioned Formula (3). This is because, when electropolymerization is conducted to form the hole transport layer, decomposition of the dye adsorbed on the semiconductor is suppressed.

In Formula (3), $R_6$ represents a hydrogen atom, a substituted or non-substituted alkyl group, an alkenyl group, an alkynyl group, an aryl group, an amino group, a cyano group or a heterocycle group. Y represents a sulfur atom, an oxygen atom or a selenium atom. $R_7$ and $R_8$ each represents a hydrogen atom, a halogen atom, a hydroxyl group a thiol group, a cyano group, a substituted or non-substituted alkyl group, an aryl group, an alkenyl group, an alkynyl group, an alkoxy group, an amino group or a heterocyclic group, provided that these groups may be mutually combined to form a ring structure. n represents an integer of 0 or more, and in the case of n≥2, two or more $R_7$ may be the same or different and two or more $R_8$ may be the same or different. X represents an acidic group. When a carbon-carbon double bond is included in Formula (3), the double bond may be either a cis-form or a trans-form.

Examples of a halogen atom represented by $R_7$ or $R_8$ include a chlorine atom, a bromine atom and a fluorine atom.

Regarding the substituted or non-substituted alkyl group, the aryl group, the alkenyl group, the alkynyl group, the alkoxy group and the heterocyclic group represented by $R_7$ or $R_8$, examples of an alkyl group include a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group and a cyclohexyl group; examples of an alkenyl group include a vinyl group, a 1-propenyl group, a 2-propenyl group, a 2-butenyl group and an allyl group; examples of an alkynyl group include a propargyl group and a 3-pentinyl group; examples of an aryl group include a phenyl group, a naphthyl group and an anthracenyl group; examples of a heterocyclic group include a furanyl group, a thienyl group, an imidazolyl group, a thiazolyl group and a morpholinyl group; and examples of an alkoxy group include a methoxy group, an ethoxy group, a propoxy group and a butoxy group.

X represents an acid group, examples of which include, a carboxyl group, a sulfo group, a sulfino group, a sulfinyl group, a phosphoryl group, a phosphinyl group, a phosphono group, a phosphonyl group, a sulfonyl group, and a salt thereof. Of these, a carboxyl group and a sulfo group are preferable.

Specific examples of a sensitizing dye will be shown below, however, the present invention is not limited thereto.

D-1
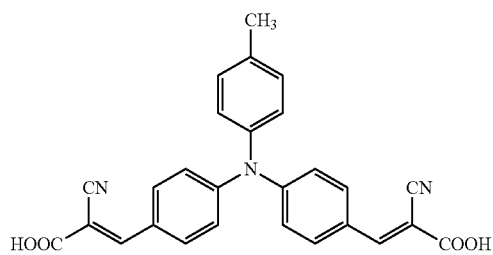

D-2
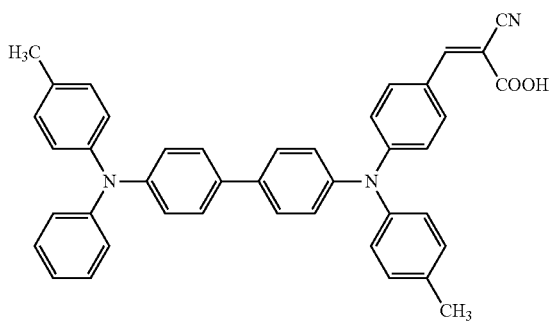

D-3
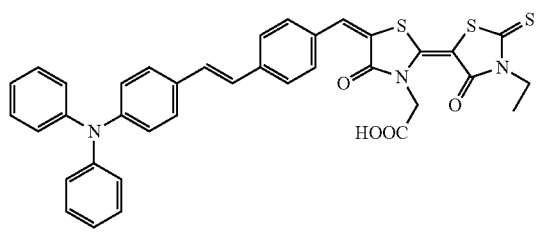

D-4
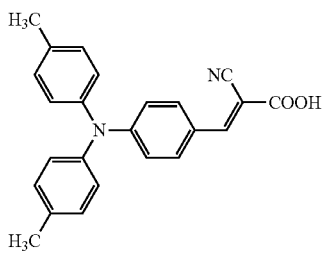

D-5
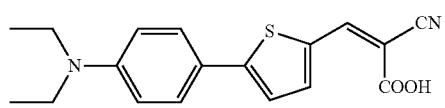

D-6
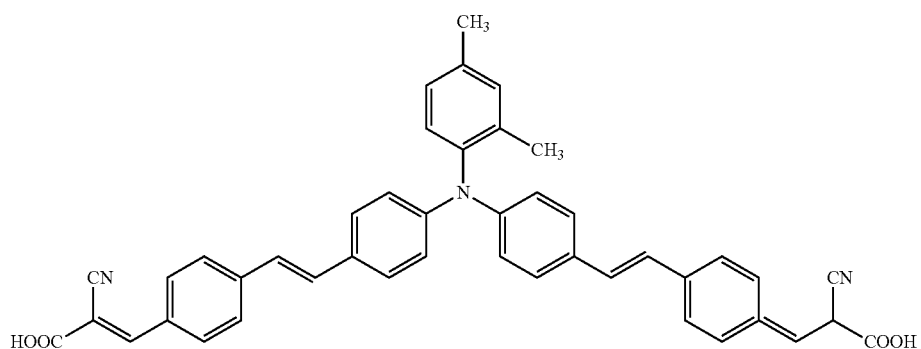

D-7
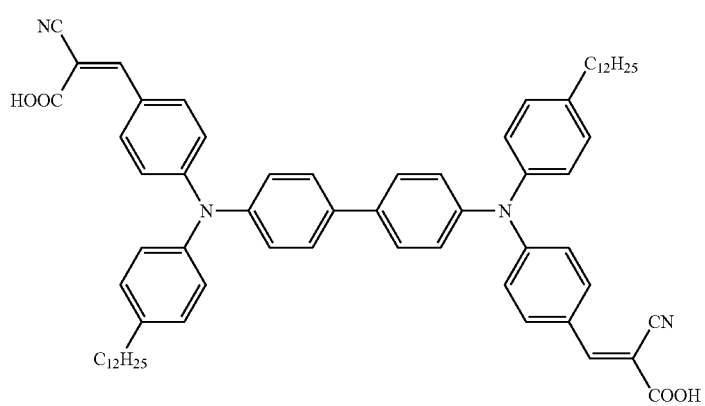

-continued
D-8
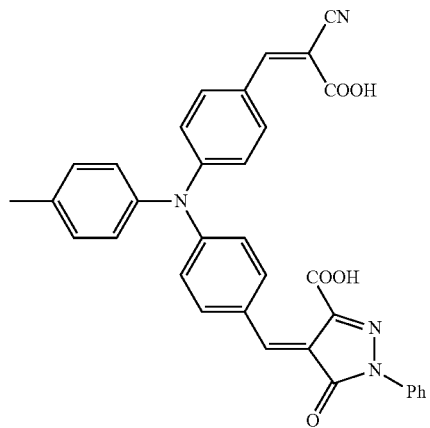
D-9
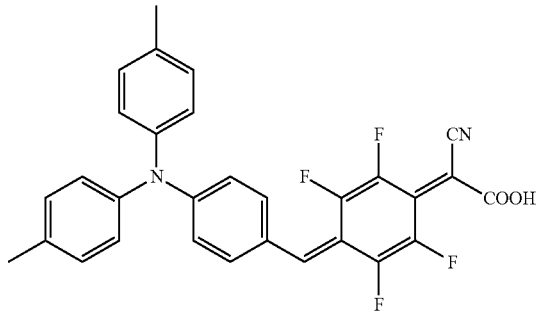
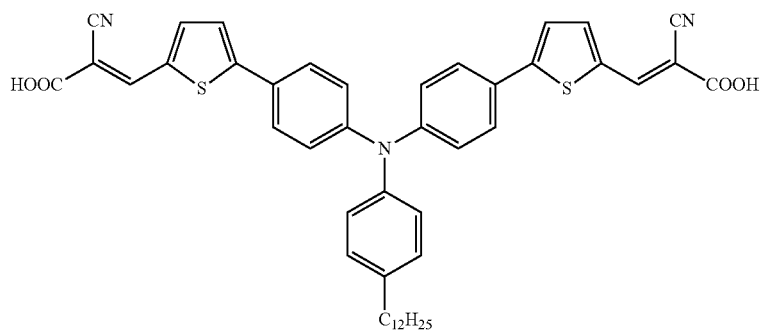
D-10
D-11
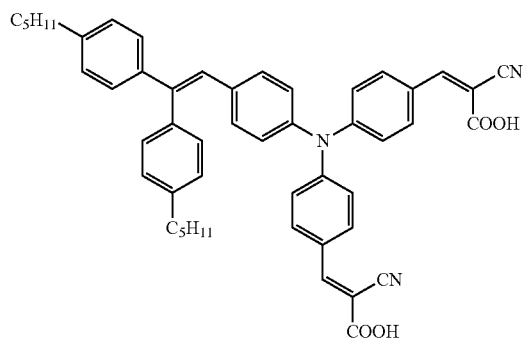
D-12
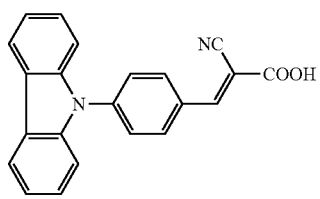
D-13
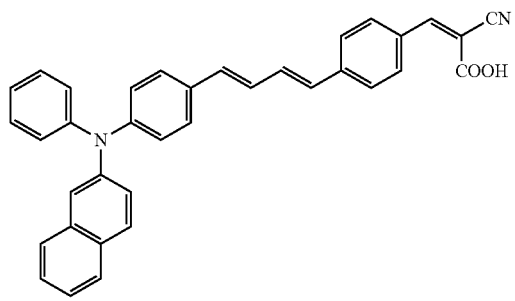
D-14
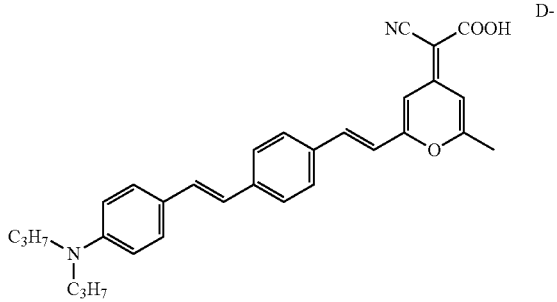

-continued
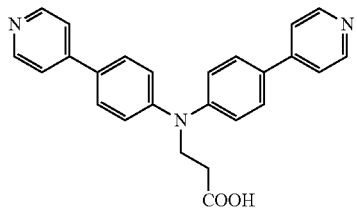
D-15
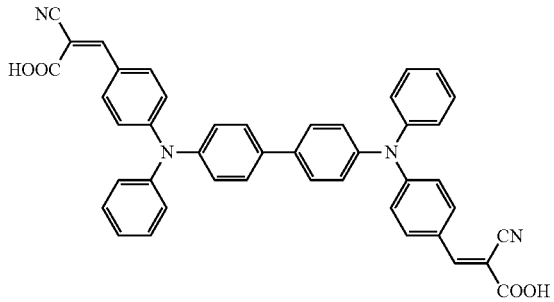
D-16
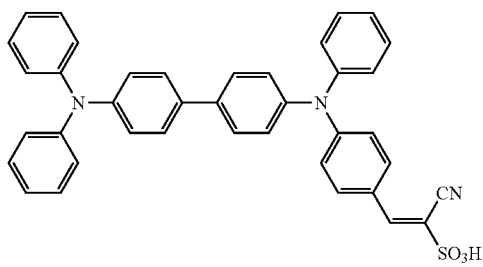
D-17
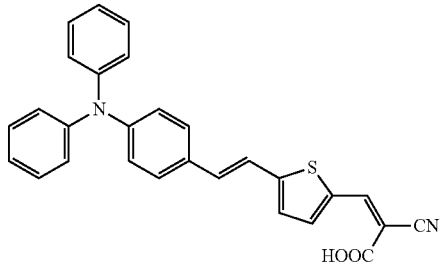
D-18
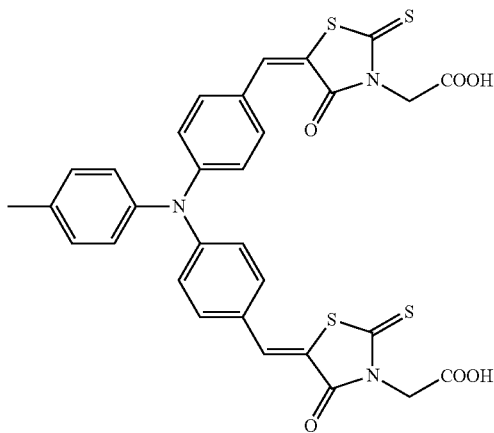
D-19
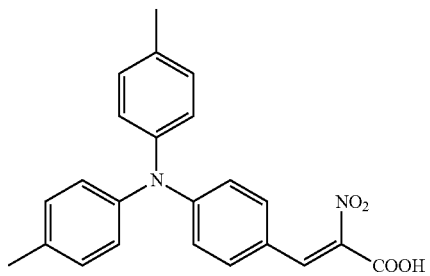
D-20
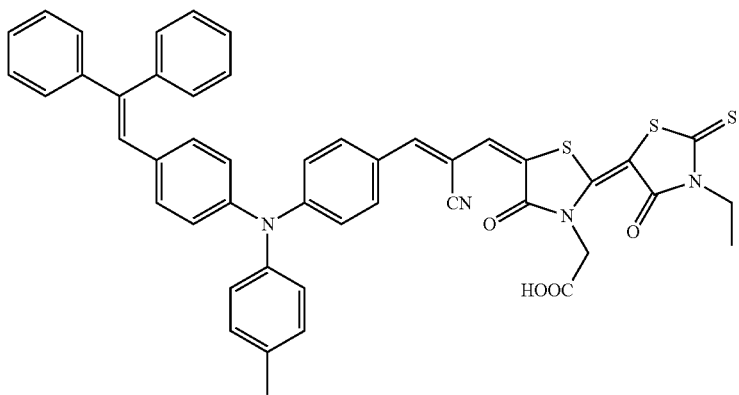
D-21

-continued
D-22
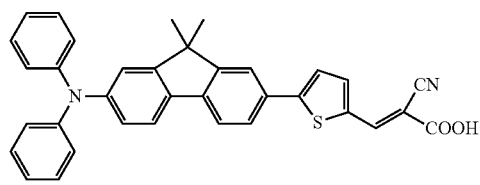
D-23
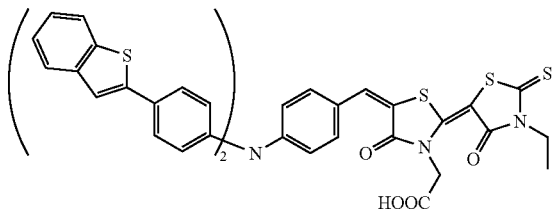
D-24
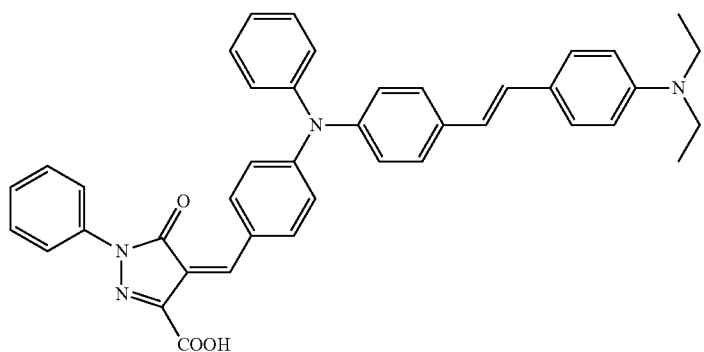
D-25
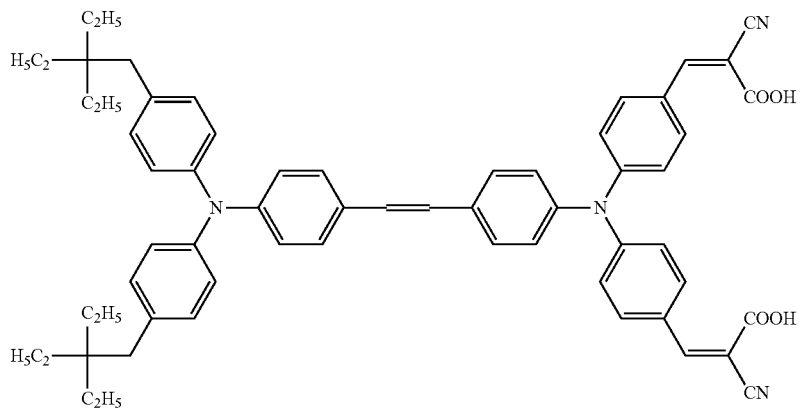
D-26
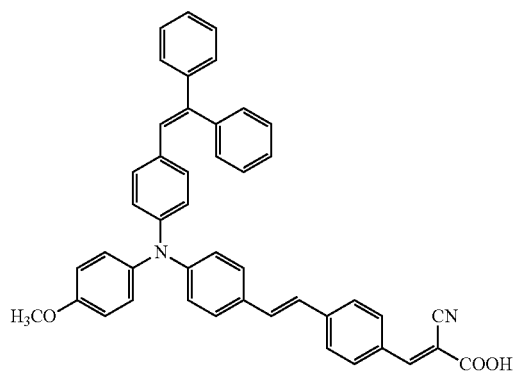
D-27
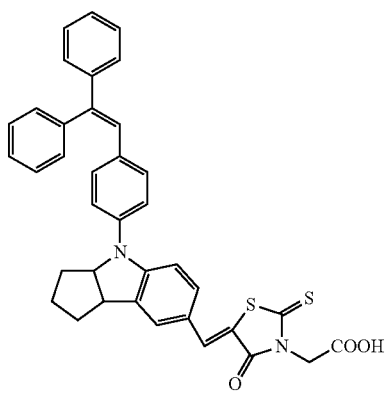

-continued
D-28
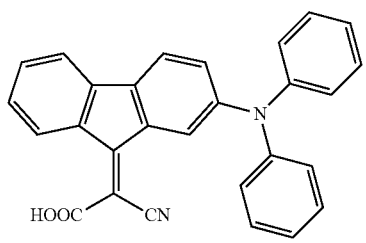
D-29
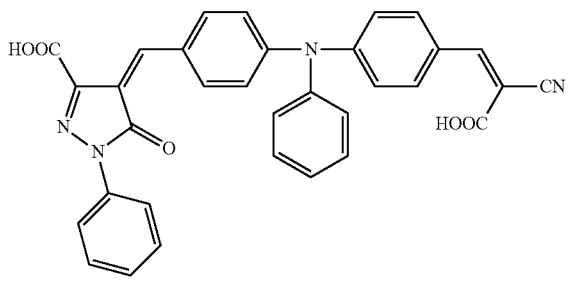
D-30
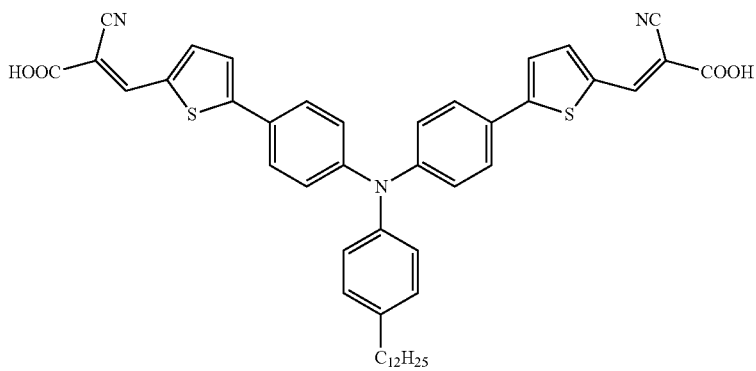
D-31
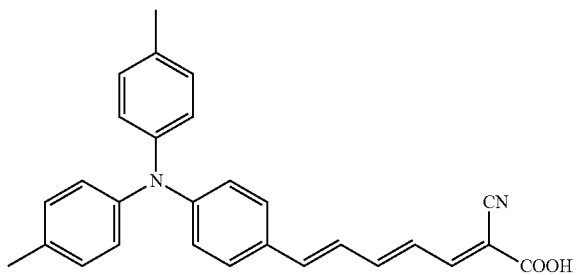
D-32
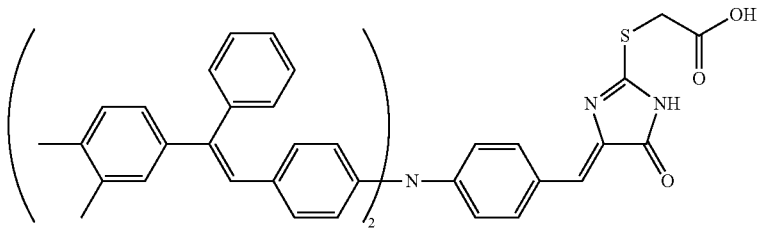
D-33
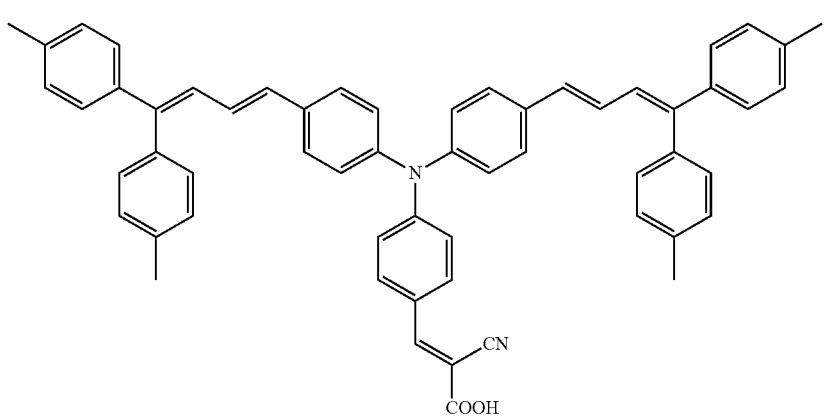

-continued
D-34
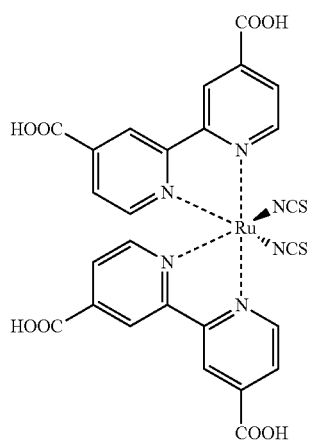
D-35
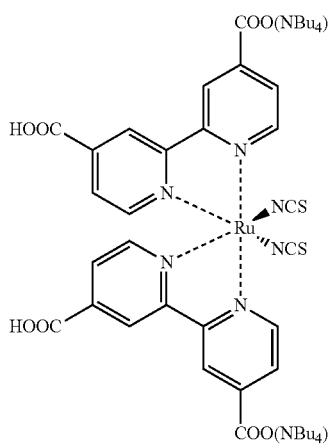
D-36
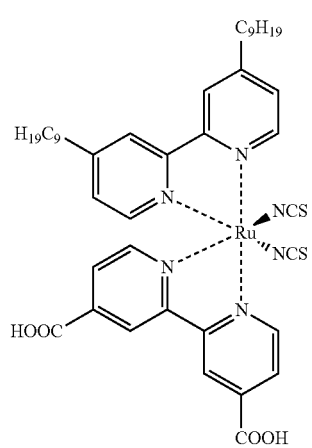
D-37
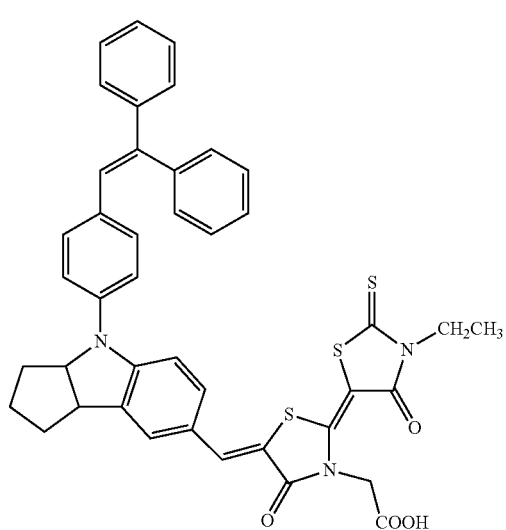
D-38
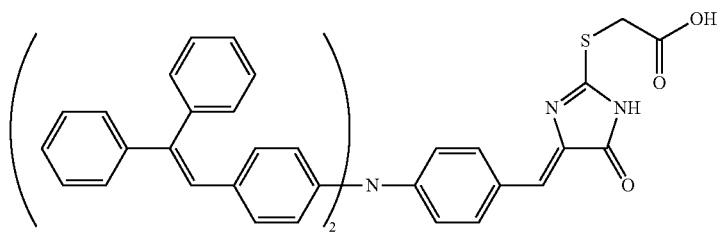
D-39
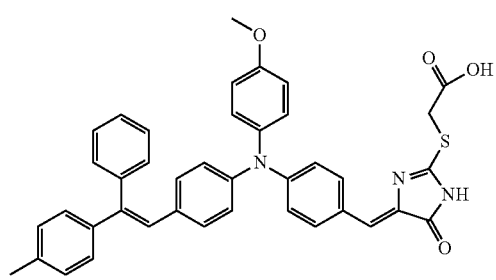
D-40
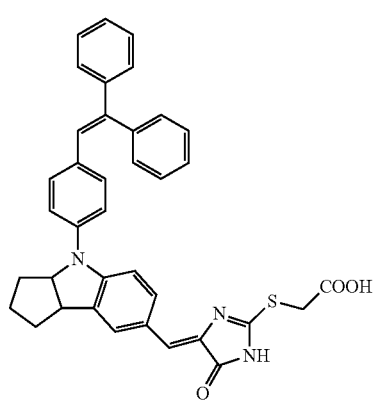

-continued

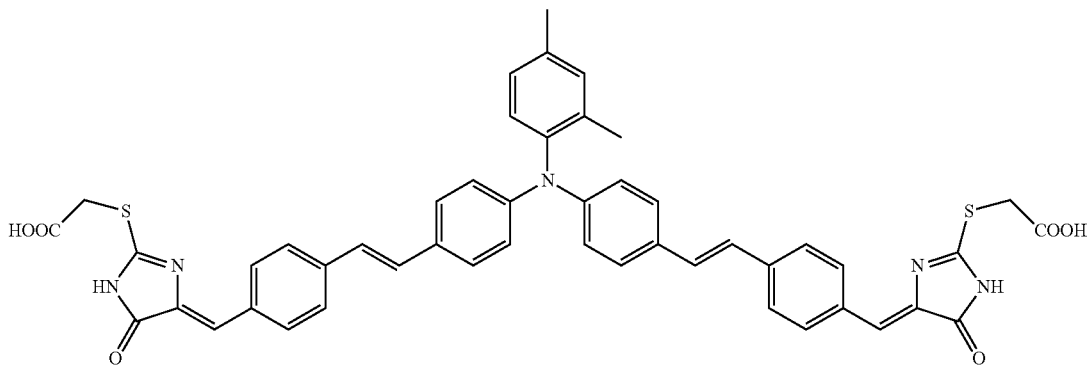
D-41

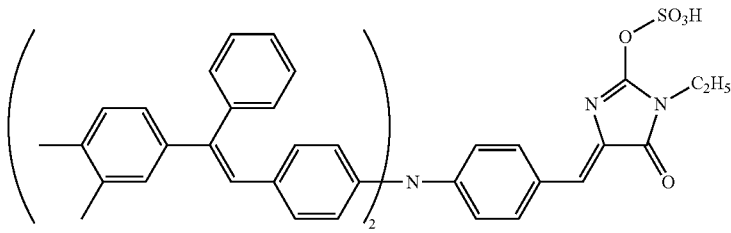
D-42

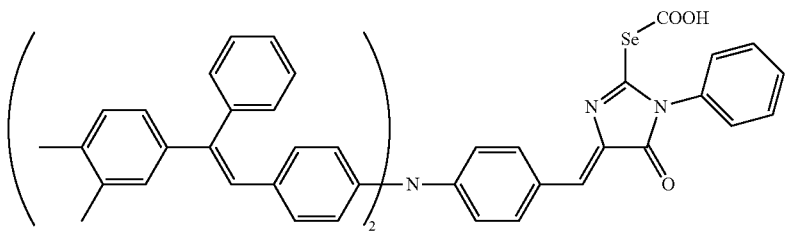
D-43

(Sensitization Process of a Semiconductor)

The total carried amount of the dye of the present invention per 1 $m^2$ of a semiconductor layer is preferably in the range of 0.01 to 100 mmole, more preferably in the range of 0.1 to 50 mmole, and specifically preferably in the range of 0.5 to 20 mmole.

When sensitization treatment is conducted, the sensitizing dye (also referred to simply as the dye) may be used solely or in combination of plural different dyes. Also, the dye is used in combination of other compound as a mixture (for example, a compound described in U.S. Pat. Nos. 4,684,537, 4,927,721, 5,084,365, 5,350,644, 5,463,057, 5,525,440, JP-A No. 7-249790, JPA No. 2000-150007).

In particular, in the case when the photoelectric conversion element of the present invention is used for a solar cell which will be mentioned later, it is desirable that two or more kinds of dyes different in absorption wavelength are used as a mixture so as to make a wavelength range of photoelectric conversion as wide as possible to effectively utilize sunlight.

In order to make a semiconductor carry the dye, as a general method, the dye is dissolved in an appropriate solvent (for example, ethanol) and in the resultant solution, a semiconductor having been dried sufficiently is dipped for a long time.

In the case when two or more kinds of sensitizing dyes are used in combination, or another dye is used in combination for sensitization treatment, a mixed solution of those dyes may be prepared and a semiconductor is dipped in the mixed solution, alternatively, a solution may be prepared separately for each of those dyes, and a semiconductor is dipped in each solution sequentially.

In the case when a solution is prepared separately for each of those dyes and a semiconductor is dipped in each solution sequentially, even if a semiconductor carries those dyes by being dipped in each solution in any order, the effects of the present invention can be acquired.

Further, those dyes may be adsorbed on semiconductor particles solely separately, and the resultant semiconductor particles supporting different dyes respectively may be mixed to prepare a photoelectric conversion element.

Moreover, in the case of a semiconductor with a higher porosity, it is preferable that before water adheres on a semiconductor thin layer and in pores in the semiconductor thin layer due to moisture or steam, the adsorbing process of dyes has been completed.

A sensitization process of a semiconductor is conducted by dissolving a sensitizing dye in a suitable solvent, and then dipping the substrate on which the above-mentioned semiconductor has been calcined in the solution, as mentioned above.

At this time, the substrate on which the semiconductor fine particle layer (also referred to as a semiconductor fine particle film) has been calcined is preferably subjected to a reduced-pressure treatment or a heating treatment in order to remove air bubbles in the layer. With these treatments, the sensitizing dye can deeply enter into the inside of the semiconductor layer (semiconductor film). Accordingly, it is specifically preferable when the semiconductor layer (semiconductor fine film) is a porous structure layer.

The solvent used for dissolving the sensitizing dye is not limited to a specific solvent, as far as the solvent can dissolve the abovementioned dye and does not dissolve nor react with the semiconductor.

However, it is preferable that a solvent is degassed and refined by distillation in advance in order to prevent moisture and gas dissolved in the solvent from entering into the semiconductor layer and disturbing a sensitization treatment such as adsorption treatment of the sensitizing dye.

Examples of a solvent preferably employed for dissolving the sensitizing dye include nitrile solvents such as acetonitrile; alcohol solvents such as methanol, ethanol and n-propanol; ketone solvents such as acetone and methylethyl ketone; ether solvents such as diethyl ether, diisopropyl ether, tetrahydrofuran and 1,4-dioxane; and halogenated hydrocarbon solvents such as methylene chloride and 1,1,2-trichloroethane, and two or more kinds of the above solvents may be used as a mixed solvent. Among the above solvents, specifically preferable are acetonitrile, a mixed solvent of acetonitrile/methanol, methanol, ethanol, acetone, methylethyl ketone, tetrahydrofuran and methylene chloride.

(Temperature and Time of Sensitization Process)

The time of immersion of the substrate on which a semiconductor layer has been sintered in a solution containing the sensitizing dye of the present invention is preferably a time during which the dye enters deeply into the semiconductor layer (or semiconductor film), promoting adsorption and achieving sufficient sensitization of the semiconductor.

Also taking into account that a decomposition product produced in decomposition of a sensitizing dye in the solution inhibits adsorption of the dye, the time of immersion is preferably from 3 to 48 hrs. at 25° C., and more preferably from 4 to 24 hrs.

This effect is specifically remarkable in a porous-structured semiconductor layer.

The foregoing immersion time is at 25° C. and it is not limited thereto when the temperature condition varies.

A solution containing the sensitizing dye of the present invention may be heated to a temperature causing no boiling, unless the dye is decomposed. The temperature range is preferably from 5 to 100° C., and more preferably from 25 to 80° C., unless the solvent boils.

(Second Electrode)

Any kind of materials having conductivity are applicable for the second electrode, and arbitrary conductive materials may be used. Even an insulating material can be used when a conductive material is provided on the surface facing the hole transport layer.

The contact between the second electrode and the hole transport layer is preferably good. The difference in work function between the second electrode and the hole transport layer is preferably small, and the second electrode is preferably chemically stable. Examples of such a material include gold, silver, copper, aluminum and platinum. An organic conductive material such as a conductive polymer may also be used.

(Solar Cell)

The solar cell of the present invention contains the aforementioned photoelectric conversion element.

The solar cell of the invention contains the photoelectric conversion element of the present invention. The solar cell of the invention and its circuit are designed most suitably for solar light and have a structure which performs most suitable photoelectric conversion when using solar light as a light source.

Namely, the solar cell possesses a structure in which a dye-sensitized semiconductor can be exposed to solar light.

In fabricating the solar cell of the present invention, it is preferable that the foregoing photoelectric conversion layer, the hole transport layer and the second electrode are housed in a case and sealed or the whole of them is sealed with a resin.

When the solar cell of the invention is exposed to a solar light or an electromagnetic wave equivalent to a solar light, a sensitizing dye carried on the semiconductor is excited by absorbing the exposed light or electromagnetic wave.

The electron generated upon excitation migrates to the semiconductor and then moves to the second electrode through the conductive substrate and an outer load, whereby the electron is supplied to the hole transport material in the hole transport layer.

On the other hand, the sensitizing dye which has allowed the electron to migrate to the semiconductor becomes an oxidized body but is reduced to return to the original state by the electron supplied from the second electrode through the polymer in the hole transport layer. At the same time, the polymer in the hole transport layer is oxidized to return to the state in which the polymer can be reduced again by the electron supplied from the second electrode.

Thus, the electron moves and the solar cell using the photoelectric conversion element of the present invention can be constituted.

EXAMPLES

Hereafter, the present invention will be explained with referring to examples, however, the present invention is not limited thereto.

[Production of photoelectric conversion element SC-1 (Reference Example]

A conductive substrate having a fluorine doped tin oxide film (FTO) with a sheet resistance of 20Ω/□ was used as the first electrode. On this substrate, a solution prepared by dissolving 1.2 ml of titanium tetrakisisopropoxide and 0.8 ml of acetylacetone in 18 ml of ethanol was dropped and then spin coated, followed by heating at 450° C. for 8 minutes, whereby a barrier layer of a titanium oxide thin layer with a thickness of 30-50 nm was formed on the transparent conductive film (FTO).

A titanium oxide paste (anatase type, a primary mean particle diameter (microscope observation average): 18 nm, ethylcellulose dispersion paste) was applied on a surface of a fluorine-doped tin oxide (FTO) conductive glass substrate having thereon the aforementioned barrier layer by a screen printing method (coating area: 25 mm$^2$). The product was subjected to sintering at 200° C. for 10 minutes and 500° C. for 15 minutes to obtain a titanium oxide thin layer having a thickness of 2.5 μm. Sensitizing dye D-6 was dissolved in a mixture solvent of (acetonitrile:t-butyl alcohol=1:1) so that a solution with a concentration of $5\times10^{-4}$ mol/l was prepared. The above FTO glass on which the titanium oxide thin layer was formed was dipped in this solution at room temperature for 3 hours, whereby the Dye 1 adsorbing process was conducted and a semiconductor electrode was prepared.

The above semiconductor electrode was immersed in an acetonitrile solution (electropolymerization solution) which contains $1\times10^{-3}$ (mole/l) of a dimer of a monomer corresponding to the repeat unit represented by Formula (1): M1-1 and 0.1 (mole/l) of $Li[(CF_3SO_2)_2N]$.

A hole transport layer was formed on the aforementioned semiconductor electrode surface by applying a voltage of −0.16 V for 30 minutes to the working electrode using a platinum plate as a counter electrode and an $Ag/Ag^+$ reference electrode ($AgNO_3$, 0.01 M), while the working electrode being irradiated with light from the semiconductor layer side (using a xenon lamp having a light intensity of 22 mW/cm², while the light of wavelength of 430 nm or less was cut). The obtained semiconductor electrode/hole transport layer was washed with acetonitrile and then dried.

The hole transport layer obtained as above was a polymer film insoluble to the solvent.

Then, the semiconductor electrode/hole transport layer was immersed in an acetonitrile solution containing $15 \times 10^{-3}$ (mole/l) of Li[(CF$_3$SO$_2$)$_2$N] and $15 \times 10^{-3}$ (mole/l) of tert-butyl pyridine for 10 minutes.

Then, after the semiconductor electrode/hole transport layer was naturally dried, 60 nm of gold film was vacuum evaporated to form the second electrode. Thus photoelectric conversion element SC-1 was obtained.

[Production of photoelectric conversion element SC-3, 6, 7, and 13 (present invention) and SC-2, 4, 5, 8, 9, 10, 11, 12 and 14 (Reference Examples)]

Photoelectric conversion elements SC-2 to 14 each were obtained in the same manner as above except that a sensitizing dye shown in Table 1 was used and a monomer corresponding to the repeat unit represented by Formula (1) or (2) shown in Table 1 was used, instead of M1-1, in the liquid for electropolymerization for forming the hole transport layer.

[Production of Photoelectric Conversion Element SC-15-17 (Comparative Examples)]

Photoelectric conversion elements SC-15 to 17 each were obtained in the same manner as the production of photoelectric conversion elements SC-1 except that a sensitizing dye shown in Table 1 was used and that M1-1 was changed to the following monomer as shown in Table 1.

Including the comparative examples, each of all the monomers was used as a dimmer to form the polymer.

M-R1, M-R2, and M-R3 show in Table 1 are shown below.

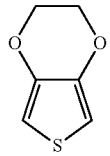

M-R1

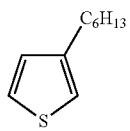

M-R2

M-R3

[Evaluation of Photoelectric Conversion Element]

The evaluation of the photoelectric conversion element of the present invention was carried out through a solar simulator (produced by EKO Instruments Co., Ltd.). Each photoelectric conversion element was exposed to a pseudo solar light of a xenon lamp at 100 mW/cm² through an AM filter (AM-1.5).

The current-voltage property of each of the photoelectric conversion elements was measured at room temperature through an I-V tester, and short circuit current density (Jsc), open circuit voltage (Voc) and fill factor (F.F.) were determined. Then, photoelectric conversion efficiency η (%) was determined from the following equation (A).

$$\eta(\%) = 100 \times (Voc \times Jsc \times F.F.)/P \quad \text{Equation (A)}$$

wherein P is intensity of incident light (mW/cm²), Voc is the open circuit voltage (V), Jsc is the short circuit current density (mA/cm²) and F.F. is the fill factor.

(Measurement of the Photoelectric Conversion Efficiency after Photodegradation Check)

After a photoelectric conversion element was irradiated with xenon lamp light of intensity 100 mW/cm² under the state of open circuit for 3 hours, photoelectric conversion efficiency (η (%)) was determined, and the ratio to initial photoelectric conversion efficiency was calculated.

(Evaluation of the Light Absorption of Hole Transport Material)

A sample for evaluation of light absorption by a hole transport material was prepared in the same manner as the aforementioned preparation of the semiconductor electrode except that the area of the titanium oxide film was 10×20 mm² and the thickness was 1.0-1.2 μm. The absorbance values before and after the electropolymerization were measured using a spectrophotometer (JASCO V-530), and the absorbance value of the polymer itself was determined from the difference between the absorbance values before and after the electropolymerization. An average value of the absorbance in the wavelength range of 400-700 nm was used as the standard value for the comparison of the light absorption by the hole transport material. In order to eliminate the fluctuation of the absorbance value due to the variation of the thickness of the titanium oxide layer, each absorbance value was divided by the average thickness of the titanium oxide layer.

The results of evaluation of the photoelectric conversion elements are summarized in Table 1.

TABLE 1

| Photoelectric conversion element | Sensitizing dye | Monomer corresponding to the repeat unit represented by Formula (1) or (2) | Short circuit current (mA/cm²) | Open circuit voltage (mV) | Fill factor | Photoelectric conversion efficiency (η (%)) Before photo-degradation check (%) | Photoelectric conversion efficiency (η (%)) After photo-degradation check (%) | Ratio of photoelectric conversion efficiencies before and after photo-degradation check | Absorbance of the polymer having repeat unit represented by Formula (1) or (2) | Remarks |
|---|---|---|---|---|---|---|---|---|---|---|
| SC-1 | D-6 | M1-1 | 5.34 | 844 | 0.57 | 2.57 | 1.70 | 0.66 | 0.80 | Reference Example |
| SC-2 | D-6 | M1-2 | 6.67 | 841 | 0.57 | 3.20 | 2.34 | 0.73 | 0.41 | Reference Example |
| SC-3 | D-40 | M1-2 | 8.10 | 901 | 0.62 | 4.52 | 3.33 | 0.74 | 0.37 | Reference Example |
| SC-4 | D-6 | M1-3 | 7.30 | 868 | 0.60 | 3.80 | 3.06 | 0.81 | 0.33 | Reference Example |
| SC-5 | D-6 | M1-4 | 7.63 | 883 | 0.63 | 4.24 | 3.28 | 0.77 | 0.27 | Reference Example |

TABLE 1-continued

| Photoelectric conversion element | Sensitizing dye | Monomer corresponding to the repeat unit represented by Formula (1) or (2) | Short circuit current (mA/cm²) | Open circuit voltage (mV) | Fill factor | Photoelectric conversion efficiency (η (%)) | | Ratio of photoelectric conversion efficiencies before and after photo-degradation check | Absorbance of the polymer having repeat unit represented by Formula (1) or (2) | Remarks |
|---|---|---|---|---|---|---|---|---|---|---|
| | | | | | | Before photo-degradation check (%) | After photo-degradation check (%) | | | |
| SC-6 | D-41 | M1-4 | 8.25 | 859 | 0.61 | 4.32 | 3.16 | 0.73 | 0.29 | Inventive |
| SC-7 | D-38 | M1-5 | 7.45 | 897 | 0.62 | 4.14 | 3.09 | 0.75 | 0.34 | Inventive |
| SC-8 | D-34 | M1-6 | 6.81 | 852 | 0.50 | 2.90 | 2.28 | 0.79 | 0.30 | Reference Example |
| SC-9 | D-37 | M1-13 | 6.59 | 806 | 0.52 | 2.76 | 2.00 | 0.72 | 0.44 | Reference Example |
| SC-10 | D-6 | M1-16 | 5.51 | 850 | 0.53 | 2.48 | 1.68 | 0.68 | 0.66 | Reference Example |
| SC-11 | D-6 | M2-1 | 6.43 | 822 | 0.60 | 3.17 | 2.48 | 0.78 | 0.38 | Reference Example |
| SC-12 | D-6 | M2-2 | 7.92 | 904 | 0.59 | 4.22 | 3.16 | 0.75 | 0.24 | Reference Example |
| SC-13 | D-38 | M2-2 | 7.79 | 921 | 0.60 | 4.30 | 3.22 | 0.75 | 0.25 | Inventive |
| SC-14 | D-6 | M2-7 | 5.54 | 810 | 0.54 | 2.42 | 1.71 | 0.71 | 0.48 | Reference Example |
| SC-15 | D-6 | M-R1 | 4.40 | 825 | 0.50 | 1.92 | 0.97 | 0.51 | 1.27 | Comparative |
| SC-16 | D-6 | M-R2 | 4.81 | 699 | 0.48 | 1.61 | 0.72 | 0.45 | 3.55 | Comparative |
| SC-17 | D-6 | M-R3 | 1.15 | 707 | 0.53 | 0.43 | 0.18 | 0.42 | 4.60 | Comparative |

From Table 1, the following results are clearly observed:

(i) Each of the photoelectric conversion elements SC-3, 6, 7, and 13 (present invention) and SC-1, 2, 4, 5, 8, 9, 10, 11, 12 and 14 (Reference Examples) exhibits a smaller light absorption by the polymer containing a repeat unit represented by Formula (1) or (2), a higher photoelectric conversion efficiency and a stabilized photoelectric conversion efficiency.

(ii) Specifically, a photoelectric conversion element having a polymer which contains a repeat unit represented by Formula (1) in which R represents a linier alkyl chain having 6-18 carbon atoms or contains a repeat unit represented by Formula (2) in which n=2 exhibits a higher photoelectric conversion efficiency.

(iii) Further, when the sensitizing dye has a substructure represented by Formula (3), a specifically higher photoelectric conversion efficiency is obtained.

(iv) Each of comparative photoelectric conversion elements exhibits a larger light absorption, a lower photoelectric conversion efficiency and an inferior stability in the photoelectric conversion efficiency.

What is claimed is:

1. A photoelectric conversion element comprising a substrate, a first electrode, a photoelectric conversion layer, a hole transport layer and a second electrode, wherein
the photoelectric conversion layer comprises a semiconductor and a sensitizing dye,
the hole transport layer comprises a polymer having a repeat unit represented by Formula (1) or (2),

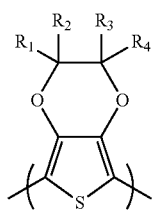

Formula (1)

wherein at least one of $R_1$-$R_4$ is a straight chain or a branched chain alkyl group having 1 to 24 carbon atoms, a cycloalkyl group having 3 to 9 carbon atoms, an alkoxy group having 1 to 18 carbon atoms, a polyethylene oxide group having 1 to 18 carbon atoms or an aryl group, and remaining substituent is a hydrogen atom,

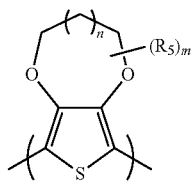

Formula (2)

wherein n is an integer of 1 to 3, m is an integer of 0 to 2n+4, $R_5$ is a halogen atom or an alkyl group, and when a plurality of $R_5$ groups are contained, each $R_5$ group may be different from each other,
the polymer has an absorbance of 0.2 to 1.0, and
the sensitizing dye has a substructure represented by Formula (3),

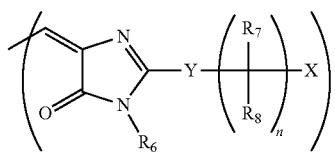

Formuial (3)

wherein $R_6$ represents a hydrogen atom, a substituted or non-substituted alkyl group, an alkenyl group, an alkynyl group, an aryl group, an amino group, a cyano group or a heterocyclic group, Y represents a sulfur atom, an oxygen atom or a selenium atom, $R_7$ and $R_8$ each represents a hydrogen atom, a halogen atom, a hydroxyl group, a thiol group, a cyano group, a substituted or non-substituted alkyl group, an aryl group, an alkenyl group, an alkynyl group, an alkoxy group, an amino group or a heterocyclic group, provided that these groups may be mutually combined to form a ring structure, n represents an integer of 0 or more, and in the case when n≥2, two or more $R_7$ may be the same or different and two or more $R_8$ may be the same or different, X represents an acidic group, and, when a carbon-carbon double bond is included in Formula (3), the double bond may be either a cis-form or a trans-form.

2. The photoelectric conversion element of claim 1, wherein at least one of $R_1$-$R_4$ of Formula (1) is a straight chain alkyl group having 6 to 18 carbon atoms.

3. The photoelectric conversion element of claim 1, wherein n of Formula (2) is 1.

4. The photoelectric conversion element of claim 1, wherein the semiconductor comprises a titanium oxide.

5. The photoelectric conversion element of claim 1, wherein the polymer further comprises a repeat unit derived from a divalent organic group represented by Formula (4),

  Formula (4)

wherein Ar represents an organic divalent group having a π-conjugated structure.

6. The photoelectric conversion element of claim 5, wherein the repeat unit derived from the divalent organic group represented by Formula (4) is derived from a thiophene derivative, a pyrrole derivative or a furan derivative.

7. The photoelectric conversion element of claim 1, wherein the hole transport layer comprises a salt comprising an organic anion.

8. The photoelectric conversion element of claim 1, wherein the hole transport layer comprises $Li[(CF_3SO_2)_2N]$.

9. The photoelectric conversion element of claim 1, wherein a content of the polymer in the hole transport layer is 50 to 100 mass % based on the mass of the hole transport layer.

10. The photoelectric conversion element of claim 1, wherein a content of the polymer in the hole transport layer is 90 to 100 mass % based on the mass of the hole transport layer.

11. The photoelectric conversion element of claim 1, wherein the hole transport layer is subjected to hole doping and an amount of doped hole is 0.15 to 0.66 hole per one repeat unit represented by Formula (1) or (2).

12. The photoelectric conversion element of claim 11, wherein an ionization potential of the polymer being subjected to hole doping is 4.5 eV to 5.5 eV.

13. The photoelectric conversion element of claim 11, wherein an ionization potential of the polymer being subjected to hole doping is 4.7 eV to 5.3 eV.

14. The photoelectric conversion element of claim 1, wherein the polymer is formed via electropolymerization carried out on the photoelectric conversion layer.

15. The photoelectric conversion element of claim 14, wherein the polymer is formed via electropolymerization while being irradiated with light.

16. The photoelectric conversion element of claim 1, wherein the photoelectric conversion layer is formed via electropolymerization employing a monomer represented by Formula (1') or (2'), or a multimer thereof,

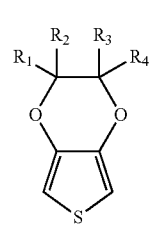 Formula (1')

wherein at least one of $R_1$-$R_4$ is a straight chain or a branched chain alkyl group having 1 to 24 carbon atoms, a cycloalkyl group having 3 to 9 carbon atoms, an alkoxy group having 1 to 18 carbon atoms, a polyethylene oxide group having 1 to 18 carbon atoms or an aryl group, and remaining substituent is a hydrogen atom,

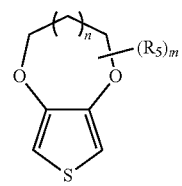 Formula (2')

wherein n is an integer of 1 to 3, m is an integer of 0 to 2n+4, $R_5$ is a halogen atom or an alkyl group, and when a plurality of $R_5$ groups are contained, each $R_5$ group may be different from each other.

17. A solar cell employing the photoelectric conversion element of claim 1.

* * * * *